United States Patent
Han et al.

(10) Patent No.: US 9,390,977 B2
(45) Date of Patent: Jul. 12, 2016

(54) METHOD FOR MANUFACTURING A FIN=SHAPED FIELD EFFECT TRANSISTOR CAPABLE OF REDUCING A THRESHOLD VOLTAGE VARIATION

(71) Applicant: Samsung Electronics Co., Ltd., Suwon-si, Gyeonggi-do (KR)

(72) Inventors: Jae Jong Han, Seoul (KR); Bon Young Koo, Suwon-si (KR); Ki Yeon Park, Hwaseong-si (KR); Jae Young Park, Yongin-si (KR); Sun Young Lee, Yongin-si (KR); Kyung In Choi, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 14/825,556

(22) Filed: Aug. 13, 2015

(65) Prior Publication Data

US 2016/0049336 A1    Feb. 18, 2016

(30) Foreign Application Priority Data

Sep. 15, 2014    (KR) .................. 10-2014-0121912

(51) Int. Cl.
*H01L 21/8238* (2006.01)
*H01L 21/8234* (2006.01)
*H01L 21/308* (2006.01)

(52) U.S. Cl.
CPC .... *H01L 21/823431* (2013.01); *H01L 21/3081* (2013.01); *H01L 21/823412* (2013.01)

(58) Field of Classification Search
CPC ............ H01L 27/0886; H01L 27/0924; H01L 27/10826; H01L 27/10879; H01L 27/1211; H01L 29/785; H01L 29/41791; H01L 29/66795; H01L 21/823431; H01L 21/823521; H01L 21/845
See application file for complete search history.

(56) References Cited

U.S. PATENT DOCUMENTS

| | | | |
|---|---|---|---|
| 7,300,837 B2 | 11/2007 | Chen et al. | |
| 7,824,983 B2 | 11/2010 | Juengling | |
| 7,973,389 B2 | 7/2011 | Rios et al. | |
| 2008/0132077 A1 | 6/2008 | Morishima | |
| 2011/0053361 A1* | 3/2011 | Muralidhar | H01L 21/3086 438/585 |
| 2013/0113026 A1 | 5/2013 | Huang et al. | |
| 2013/0164907 A1 | 6/2013 | Lee | |
| 2014/0120691 A1 | 5/2014 | Lee et al. | |

FOREIGN PATENT DOCUMENTS

| KR | 10-2007-0000758 A | 1/2007 |
|---|---|---|
| KR | 10-1051180 B1 | 7/2011 |
| KR | 10-2013-0072798 A | 7/2013 |
| KR | 10-2014-0052693 A | 5/2014 |

\* cited by examiner

*Primary Examiner* — Hoai V Pham
(74) *Attorney, Agent, or Firm* — Harness, Dickey & Pierce, P.L.C.

(57) ABSTRACT

A method for manufacturing a semiconductor device includes forming a trench defining a plurality of active fins in a substrate, forming a sacrificial layer on the plurality of active fins, forming a sacrificial oxide layer, and removing the sacrificial oxide layer. The forming the sacrificial oxide layer includes heat-treating the sacrificial layer and surfaces of the plurality of active fins.

20 Claims, 24 Drawing Sheets

METHOD FOR MANUFACTURING A FIN=SHAPED FIELD EFFECT TRANSISTOR CAPABLE OF REDUCING A THRESHOLD VOLTAGE VARIATION

CROSS-REFERENCE TO RELATED APPLICATION

This application claims priority under 35 U.S.C. §119 to Korean Patent Application No. 10-2014-0121912 filed on Sep. 15, 2014, with the Korean Intellectual Property Office, the entire disclosure of which is incorporated herein by reference.

BACKGROUND

Example embodiments relate to a method for manufacturing a semiconductor device.

Complementary metal oxide silicon (CMOS) field effect transistors (FETs) have been continuously reduced in size due to demand for high degrees of integration and performance thereof. However, an increase in a short channel effect may make it difficult to enhance performance through a reduction in a size of transistors.

SUMMARY

Example embodiments relate to methods for manufacturing a field effect transistor (FET) capable of reducing a threshold voltage Vth variation and obtaining a desired driving current in a fin-shaped field effect transistor (FinFET) of 10 nm or less.

According to example embodiments, a method for manufacturing a semiconductor device may include forming a trench defining a plurality of active fins in a substrate, forming a sacrificial layer on the plurality of active fins, forming a sacrificial oxide layer on the plurality of active fins, and removing the sacrificial oxide layer. The forming the sacrificial oxide layer may include heat-treating the sacrificial layer and surfaces of the plurality of active fins.

In example embodiments, the sacrificial layer may include a material having an oxygen permeability that is lower than an oxygen permeability of silicon oxide.

In example embodiments, the sacrificial layer may include one of SiN, SiON, SiC, SiCN, SiOCN, SiOC, SiBN, SiBCN, and combinations thereof.

In example embodiments, the sacrificial layer may have a thickness ranging from 1 nm to 5 nm.

In example embodiments, the forming the sacrificial oxide layer may include performing a first heat treatment operation under an oxidation atmosphere and performing a second heat treatment operation performed under a non-oxidation atmosphere.

In example embodiments, the forming the sacrificial oxide layer may include forming a first sacrificial oxide layer as the sacrificial layer is oxidized during the first heat treatment operation, and forming a second sacrificial oxide layer as portions of the active fins below the first sacrificial oxide layer are oxidized.

In example embodiments, a thickness of the second sacrificial oxide layer may be greater than 0 nm and less than or equal to 1 nm.

In example embodiments, the performing the first heat treatment operation may include using oxygen radicals generated from one of $O_2$, $O_3$, $H_2O$, NO, $N_2O$, and combinations thereof.

In example embodiments, the performing the second heat treatment operation may include using one of $H_2$, $N_2$, $NH_3$, He, Ar, Kr, Xe and combinations thereof.

In example embodiments, the forming the plurality of active fins may include forming a mask pattern on the substrate, and etching the substrate using the mask pattern as an etch mask. the forming the sacrificial layer may include forming the sacrificial layer on the mask pattern, lateral surfaces of the plurality of active fins, and the substrate.

In example embodiments, the method may further include forming an isolation layer on the substrate such that upper portions of the plurality of active fins protrude through the isolation layer. The forming the sacrificial layer and the forming the sacrificial oxide layer may be performed after the forming the isolation layer.

In example embodiments, the forming the isolation layer may include forming an insulating layer filling the trench between the plurality of active fins, and exposing the upper portions of the plurality of active fins by etching the insulating layer. The forming the sacrificial layer may include forming the sacrificial layer on upper surfaces and lateral surfaces of the exposed upper portions of the active fins and on the isolation layer.

In example embodiments, the forming sacrificial layer and the forming the sacrificial oxide layer may be performed in-situ.

In example embodiments, the method may further include forming a gate insulating layer and a gate electrode on the active fins after the removing the sacrificial layer.

According to example embodiments, a method for manufacturing a semiconductor device may include forming a trench that defines a plurality of active fins in a substrate; forming an isolation layer filling a lower portion of the trench to height that is below a height of the plurality of active fins such the plurality of active fins protrude through the isolation layer; depositing a sacrificial layer on upper surfaces and lateral surfaces of the plurality of active fins; forming a sacrificial oxide layer; removing the sacrificial oxide layer; and forming a gate structure on the plurality of active fins that traverses the plurality of active fins. The forming the sacrificial oxide layer may include oxidizing the sacrificial layer and surfaces of the plurality of active fins.

According to example embodiments, a method for manufacturing a semiconductor device includes forming a sacrificial layer contacting at least a sidewall of a plurality of active fins, the plurality of active fins defined by a trench in a substrate and each including corners at a top portion; and rounding the corners of the top portion of the plurality of active fins. The rounding the corners includes transforming the sacrificial layer into first and second sacrificial oxide layers, and removing the first and second sacrificial oxide layers.

In example embodiments, the sacrificial layer may include a material having an oxygen permeability that is lower than an oxygen permeability of silicon oxide.

In example embodiments, the rounding the corners may include performing a first heat treatment operation and a second heat treatment operation. The first heat treatment operation may be performed under an oxidation atmosphere to form the first sacrificial oxide layer. The second heat treatment operation may be performed under a non-oxidation atmosphere to form the second sacrificial oxide layer. The second heat treatment operation may be performed after the first heat treatment operation.

In example embodiments, the method may further include forming a gate insulating layer on the active fins after the removing the first and second sacrificial oxide layers, and forming a gate electrode on the gate insulating layer. The sacrificial layer may include one of SiN, SiON, SiC, SiCN, SiOCN, SiOC, SiBN, SiBCN, and combinations thereof.

In example embodiments, a thickness of the sacrificial layer may be in a range from 1 nm to 5 nm. A thickness of the second sacrificial oxide layer may be greater than 0 nm and less than or equal to 1 nm.

BRIEF DESCRIPTION OF DRAWINGS

The above and other aspects and features of example embodiments will be more clearly understood from the following detailed description taken in conjunction with the accompanying drawings, in which.

DETAILED DESCRIPTION

Figure 1:
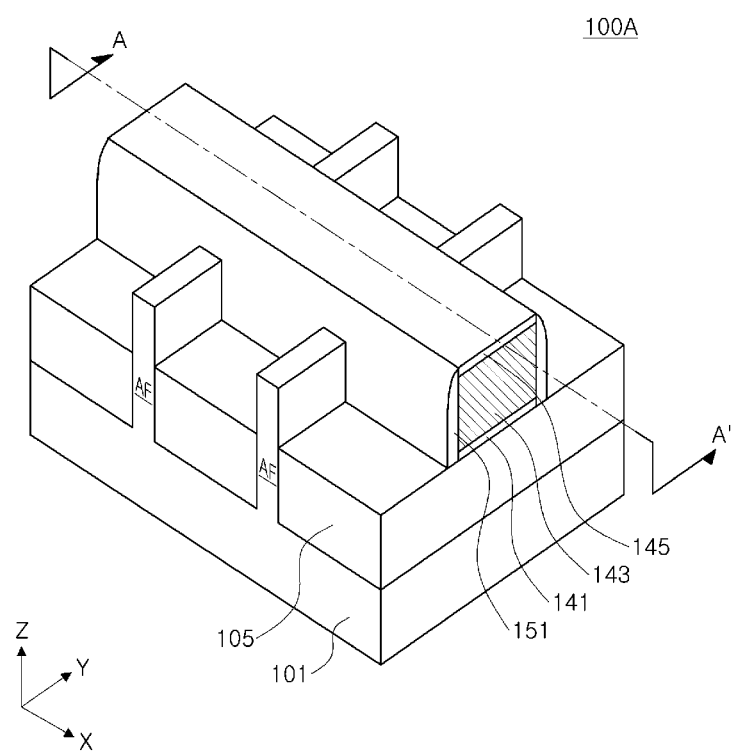
FIG. 1 is a perspective view schematically illustrating a semiconductor device according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference characters and/or numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a perspective view schematically illustrating a semiconductor device according to example embodiments.

Referring to FIG. 1, a semiconductor device 100A according to example embodiments may include a substrate 101 including active fins AF defined by an isolation layer 105, a gate electrode 143 disposed to traverse the active fins AF, a gate insulating layer 141 disposed between the gate electrode 143 and the active fins AF, and a spacer 151 disposed on both side walls of the gate electrode 143. The gate insulating layer 141 may also be disposed between the gate electrode 143 and the isolation layer 105.

In detail, the substrate 101 may be formed of one or more semiconductor materials selected from the group consisting of Si, Ge, SiGe, GaP, GaAs, SiC, SiGeC, InAs, and InP. Also, the substrate 101 may be a semiconductor-on-insulator substrate. For example, the substrate 101 may be a silicon-on-insulator (SOI) substrate.

The active fins AF may extend in a first direction (y direction). The active fins AF may be a portion of the substrate 101 or may include an epitaxial layer grown from the substrate 101. For example, the active fins AF may be a portion of the substrate formed of a single crystal silicon (Si), and the epitaxial layer may be one of Ge, SiGe, and SiC.

The isolation layer 105 may be disposed to cover the lower portions of the sides of the active fins AF. The isolation layer 105 may be formed of an insulating material. For example, the isolation layer 105 may be formed of at least one of a borophosphosilicate glass (BPSG), a high density plasma (HDP) oxide, a flowable oxide (FOX), a tonen silazene (TOSZ), a spin on glass (SOG), an undoped silica glass (USG), a tetraethylorthosilicate (TEOS), and a low temperature oxide (LTO).

The gate insulating layer 141 may be disposed between the gate electrode 143 and the active fins AF and between the gate electrode 143 and the isolation layer 105. In example embodiments, the gate insulating layer may include one of a silicon oxide layer, a silicon oxynitride layer, and combinations thereof. According to example embodiments, the gate insulating layer 141 may include a high-k dielectric layer having a high permittivity. For example, the high-k dielectric layer may be at least one of a tantalum oxide, a titanium oxide, a hafnium oxide, a zirconium oxide, an aluminum oxide, an yttrium oxide, a niobium oxide, a hafnium silicate, a zirconium silicate, and combinations thereof.

The gate electrode 143 may extend in a second direction (x direction). The gate electrode 143 may cover the active fins AF. In example embodiments, the gate electrode 143 may include doped polycrystalline silicon. According to example embodiments, the gate electrode 143 may include a metal. For example, the metal may include at least one of aluminum (Al), tungsten (W), and molybdenum (Mo).

The spacer 151 disposed on both side walls of the gate electrode 143 may include one of a nitride layer and an oxynitride layer.

Although not shown, according to example embodiments, the semiconductor device 100A may further include source and drain regions doped with an impurity within the active fins AF on both sides of the gate electrode 143. According to example embodiments, the semiconductor device 100A may include a channel region disposed below the gate insulating layer 141 within the active fins AF.

FIGS. 2A through 2H are cross-sectional views illustrating a method for manufacturing a semiconductor device illustrated in FIG. 1 according to example embodiments. Specifically, FIGS. 2A through 2H are cross-sectional views taken along line A-A' of FIG. 1, illustrating each stage. FIG. 3 is a flow chart illustrating a method for manufacturing a semiconductor device according to example embodiments.

Figure 2A:
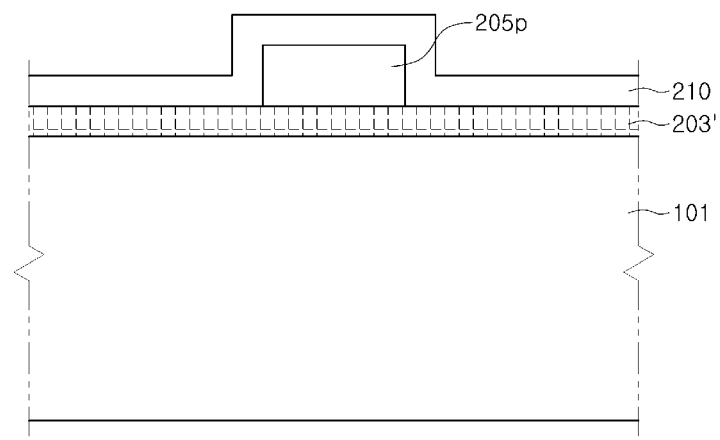
FIGS. 2A through 2H are cross-sectional views illustrating a method for manufacturing a semiconductor device illustrated in FIG. 1 according to example embodiments.
Figure 3:
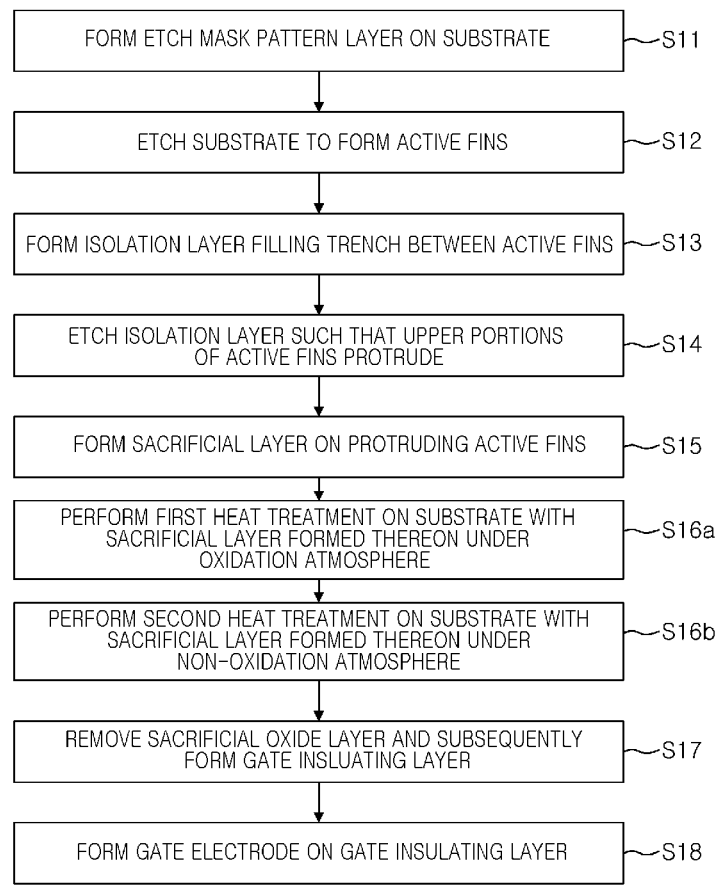
FIG. 3 is a flow chart illustrating a method for manufacturing a semiconductor device according to example embodiments.

Referring to FIG. 2A, a hard mask layer 203' and a sacrificial pattern layer 205p may be sequentially formed.

First, although not shown, a photoresist layer may be formed and patterned through a photolithography process. Subsequently, an etching process may be performed on a sacrificial layer formed on the hard mask layer 203' using the patterned photoresist layer as an etching mask. As a result, the sacrificial layer 205p may be formed on the hard mask layer 203'. As the etching process, for example, reactive ion etching (RIE) may be used.

The size of the sacrificial pattern layer 205p may be determined in consideration of a space between the active fins AF (please refer to FIG. 2C) intended to be formed in a follow-up process.

The hard mask layer 203' may be formed of at least one of a silicon-containing material such as a silicon oxide ($SiO_2$), a silicon oxynitride (SiON), a silicon nitride ($Si_3N_4$), or polysilicon, a hydrocarbon compound such as photoresist, an amorphous carbon layer (ACL), or a spin-on-hardmask (SOH), and a metal. For example, the hard mask layer 203' may have a multilayer structure in which a silicon oxide and a silicon nitride are sequentially stacked.

Next, a preliminary spacer layer 210 may be formed on the substrate 101 with the sacrificial pattern layer 205p formed thereon. The preliminary spacer layer 210 may have a substantially uniform thickness on an upper surface of the substrate 101 with the sacrificial pattern layer 205p formed thereon. The preliminary spacer layer 210 and the sacrificial pattern layer 205p may be formed of material having etch selectivity with respect to each other. The preliminary spacer layer 210 may be formed of a material that is different than a material of the sacrificial pattern layer 205p. For example, the preliminary spacer layer 210 and the sacrificial pattern layer 205p may be formed of at least one of silicon-containing material such as a silicon oxide ($SiO_2$), a silicon oxynitride (SiON), a silicon nitride ($Si_3N_4$), or polysilicon, a hydrocarbon compound such as photoresist, an amorphous carbon layer (ACL), or a spin-on-hardmask (SOH), and a metal. In example embodiments, the preliminary spacer layer 210 may be formed of polysilicon, and the sacrificial pattern layer 205 may be formed of a hydrocarbon compound. However, example embodiments are not limited thereto.

The preliminary spacer layer 210 may be formed through a process such as atomic layer deposition (ALD), chemical vapor deposition (CVD), or spin coating, and according to materials, a baking process or a curing process may be additionally performed.

Figure 2B:
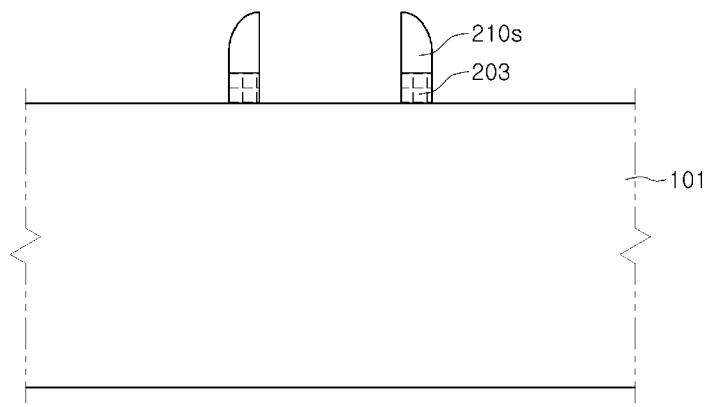

Referring to FIGS. 2B and 3, an etch mask pattern layer 210s and 203 for forming active fins AF may be formed in operation S11.

First, the preliminary spacer layer 210 may be etched through an anisotropic etching process until the hard mask layer 203' is exposed, whereby spacer layers 210s may be formed. As the anisotropic etching process, reactive ion etching (RIE) may be used.

The spacer layers 210s may be used as etch masks in patterning the hard mask layer 203'. Thus, widths of the spacer layers 210s on the side walls of the sacrificial pattern layer 205p may be determined in consideration of the width of active fins AF (please refer to FIG. 2C). The widths of the spacer layers 210s may be appropriately adjusted depending on thickness and etching conditions of the preliminary spacer layer 210. The widths of the spacer layers 210s may be subsequently equal.

Subsequently, the sacrificial pattern layer 205 may be removed to leave only the spacer layers 210s. The removing of the sacrificial pattern layer 205p may include a selective etching process for minimizing etching of the spacer layers 210s.

Thereafter, the hard mask layer 203' may be etched using the spacer layers 210s as etching masks to form the hard mask pattern layer 203. After the etching process to form the hard mask pattern layer 203 is completed, the spacer layers 210s may remain on the hard mask pattern layers 203. In another example embodiment, the spacer layers 210s may be completely removed depending on a thickness ratio or etch selectivity of the hard mask pattern layer 203 and the spacer layers 210s.

Figure 2C:
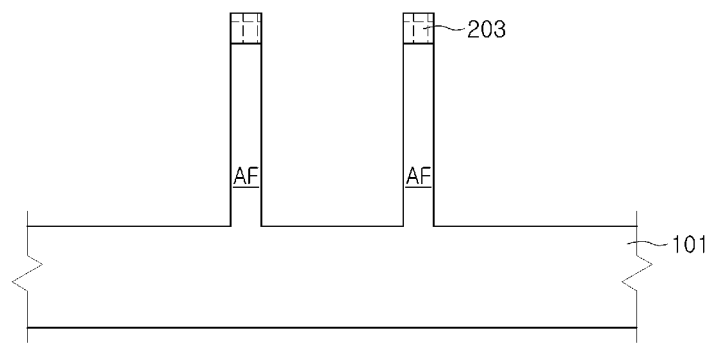

Referring to FIGS. 2C and 3, the substrate 101 may be etched using the etching mask pattern layers 210s and 203 defining active fins AF to form the active fins AF in operation S12.

The active fins AF may have a desired (and/or alternatively predetermined) width determined by the width of the spacer layer 210s. The active fins AF may have a line shape having a narrow width and extend in the first direction (y direction in FIG. 1). A trench may be formed between the active fins AF through the anisotropic etching process. In FIG. 2C, the slope of the side wall is illustrated as being perpendicular, but example embodiments are not limited thereto. According to example embodiments, the slope of the side walls may have a desired (and/or alternatively predetermined) value, rather than being perpendicular, and thus, the width of the trench may decrease downwardly.

As the anisotropic etching process, an RIE process may be used. While the anisotropic etching process is being performed, the surface of the substrate 101 and the sides of the active fins AF may be etch-damaged due to collisions of ionized particles, causing a trap site or a lattice defect on the surface of the substrate 101 and on the sides of the active fins AF.

Figure 2D:
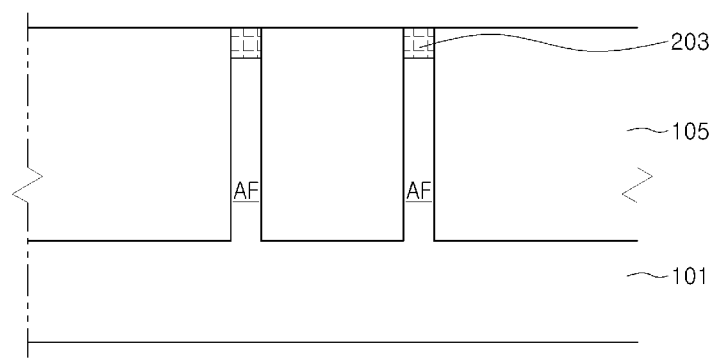

Referring to FIGS. 2D and 3, an isolation layer 105 may be formed to fill the trench between the active fins AF in operation S13.

First, an insulating layer may be formed to fill the trench between the active fins AF, and a process of planarizing the insulating layer may subsequently be performed to expose an upper surface of the hard mask pattern layer 203.

The insulating layer may be formed of at least one of a borophosphosilicate glass (BPSG), a high density plasma (HDP) oxide, a flowable oxide (FOX), a tonen silazene (TOSZ), a spin-on-glass (SOG), an undoped silica glass (USG), a tetraethylorthosilicate (TEOS), and a low temperature oxide (LTO), having excellent gap-fill characteristics.

The planarizing of the insulating layer may be a chemical mechanical polishing (CMP) process.

Figure 2E:
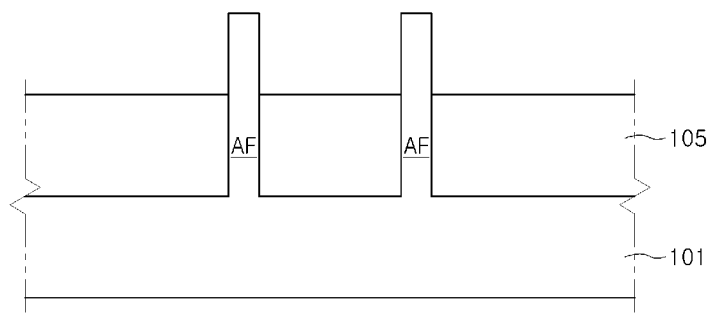

Referring to FIGS. 2E and 3, the isolation layer 105 may be etched such that the active fins AF protrude upwardly in operation S14.

First, the hard mask pattern layer 203 may be removed by using a selective etching process, while restraining etching of the isolation layer 105. For example, in a case in which the hard mask pattern layer 203 is formed of a silicon nitride and the isolation layer 105 is formed of a silicon oxide, the hard mask pattern layer 203 may be removed using a phosphoric acid ($H_3PO_4$).

Subsequently, the isolation layer 105 may be recessed to a desired (and/or alternatively predetermined) depth using dry etching such that the active fins AF protrude from the isolation layer 105. While the dry etching process is being performed, upper surfaces and lateral surfaces of the active fins AF may be etch-damaged. According to example embodiments, a process of recessing the isolation layer 105 may be performed using wet etching.

Alternatively, after the isolation layer 105 is recessed to the desired (and/or alternatively predetermined) depth using a dry or wet etching process, the mask pattern layer 203 may be removed through an additional wet etching process.

Figure 2F:
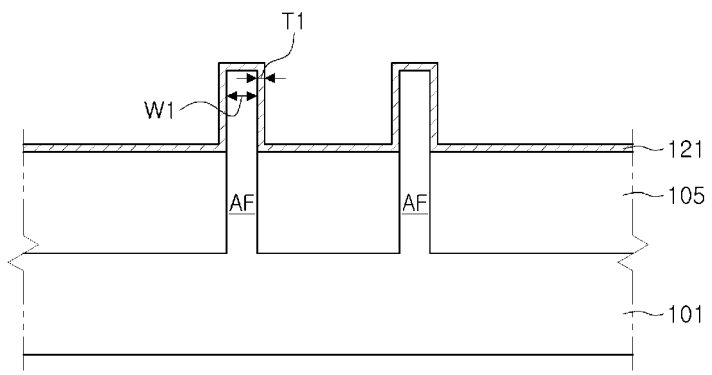

Referring to FIGS. 2F and 3, a sacrificial layer 121 may be formed on the active fins AF protruding from the isolation layer 105 in operation S15.

In detail, the sacrificial layer 121 may be formed on the upper and lateral surfaces of the active fins AF protruding from the isolation layer 105, and simultaneously, the sacrificial layer 121 may also be formed on the isolation layer 105 between the active fins AF. A thickness T1 of the sacrificial layer 121 may be equal in the upper surfaces and lateral surfaces of the active fins AF. Before the formation of the sacrificial layer 121, a cleaning process may be performed to remove contaminants generated during the etching process.

As described above, while the etching process is performed to form the active fins AF or while the isolation layer 105 is recessed, the surfaces of the active fins AF may be etch-damaged. In order to cure the damage, a sacrificial oxidation process may be performed. As the damaged surfaces of the active fins AF are oxidized by the sacrificial oxidation process, a sacrificial oxide layer may be formed. By removing the sacrificial oxide layer through a wet etching process using a buffer oxide etchant (BOE) solution, the damaged surfaces of the active fins AF may be cured. In other words, the amount of damage on the etch-damaged surfaces of the active fins AF may be reduced and/or eliminated by cleaning the active fins AF, forming the sacrificial oxidation layer and removing the sacrificial oxide layer.

For example, as the sacrificial oxide layer is formed, upper corners of the active fins AF are rounded, and in addition, the lateral surfaces of the active fins AF are oxidized to end up with active fins AF having a reduced width. As the upper corners of the active fins AF are further rounded, the upper width of the active fins AF may be further narrowed. As a result, even though the active fins AF are formed to have a uniform width by etching process, the upper width of the active fins AF becomes narrower than the lower width of the active fins AF after the sacrificial oxidation process.

As the width of the active fins AF is changed, a threshold voltage Vth of a field effect transistor (FET) may be changed. Also, when the width of the active fins AF is reduced, a driving circuit of the FET may be lowered. In particular, when the width of the active fins AF is equal to or lower than 10 nm, characteristics of the transistor may be significantly changed due to the reduction in the upper width of the active fins AF due to the sacrificial oxidation process. For example, in a case in which the width of the active fins is reduced to 4 nm or less, a driving current may be rapidly reduced due to a quantum confinement effect.

Thus, during the sacrificial oxidation process to cure the etch damage to the surfaces of the active fins AF, the width of the active fins AF may be held to a desired (and/or alternatively predetermined) level (e.g., 4 nm or greater) by reducing loss of the active fins AF. In other words, an amount of oxidation of the active fins AF may be reduced during the sacrificial oxidation process. In particular, it is important to secure a desired (and/or alternatively predetermined) level of the upper width of the active fins AF by rounding the upper width of the active fins AF during the sacrificial oxidation process.

In example embodiments, the sacrificial layer 121 covering upper surfaces and lateral surfaces of the active fins AF may be formed to reduce an amount of oxidization of the active fins AF during the follow-up sacrificial oxidation process (first heat treatment (S16a)).

The sacrificial layer 121 may include a material having oxygen permeability lower than that of a silicon oxide. For example, the sacrificial layer 121 may be any one selected from the group consisting of SiN, SiON, SiC, SiCN, SiOCN, SiOC, SiBN, and SiBCN. According to example embodiments, the sacrificial layer 121 may have a multilayer structure including materials selected from the foregoing group.

The sacrificial layer 121 may be formed to have an appropriate thickness T1 within a thickness range from 1 nm to 5 nm in consideration of conditions of the follow-up sacrificial oxidation process. If the sacrificial layer 121 is excessively thick, the surfaces of the active fins AF below the sacrificial layer may not be oxidized during the follow-up sacrificial oxidation process (first heat treatment (S16a)) or a process time for oxidizing the surfaces of the active fins AF may be unnecessarily lengthened. If the sacrificial layer 121 is excessively thin, oxidization of the surfaces of the active fins AF may not be properly controlled. In example embodiments, the sacrificial layer 121 may be formed to have a thickness T1 ranging from 1 nm to 2 nm.

The sacrificial layer 121 may be formed through a low pressure chemical vapor deposition (LPCVD) process or atomic layer deposition (ALD) process.

Figure 2G:
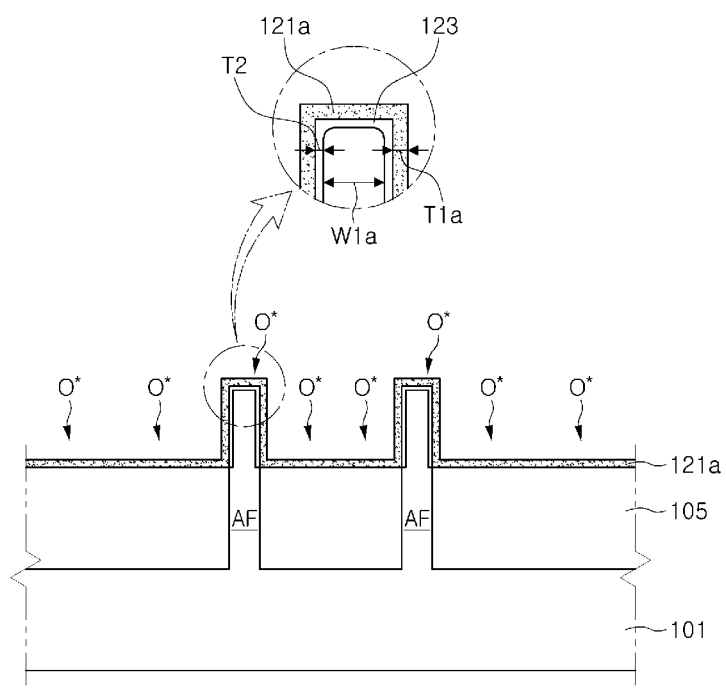

Referring to FIGS. 2G and 3, a process of heat-treating the substrate 101 with the sacrificial layer 121 formed thereon may be performed in operations S16a and S16b.

The heat treatment process may include first heat treatment operation S16a performed under an oxidation atmosphere and a second heat treatment operation S16b performed under a non-oxidation atmosphere.

The first heat treatment operation S16a is an operation of performing a sacrificial oxidation process. The materials enumerated to be used as materials of the sacrificial layer 121 have a low level of oxygen permeability and thus, the sacrificial oxidation process may be performed using oxygen radicals having a size smaller than that of oxygen ($O_2$) and having high reactivity.

The first heat treatment operation S16a may be performed using oxygen radicals generated from any one selected from the group consisting of $O_2$, $O_3$, NO, $N_2O$, $H_2O$, and combinations thereof. In detail, the first heat treatment operation S16a may be performed in a thermal radical oxidation manner or a plasma radical oxidation manner. In a case in which the first heat treatment operation S16a is performed in the thermal radical oxidation manner, oxygen radicals may be generated by injecting oxygen ($O_2$) or ozone ($O_3$) together with hydrogen ($H_2$) at a temperature ranging from 700° C. to 1000° C. and pressure ranging from a few mTorr to tens of Torr. In a case in which the first heat treatment operation S16a is performed in a plasma radical oxidation manner, oxygen radicals may be generated by injecting an oxygen-contained gas (e.g., $O_2$, $O_3$, $H_2O$, NO, or $N_2O$) into an inert gas (e.g., argon (Ar) or xenon (Xe)) plasma at a temperature ranging from 300° C. to 700° C. and at pressure ranging from a few mTorr to tens of Torr.

The second heat treatment operation S16b is additionally performed to anneal etch-damaged surfaces of the active fins AF (e.g., lattice defect). The second heat treatment operation S16b may be performed using any one selected from the group consisting of $H_2$, $N_2$, $NH_3$, He, Ar, Kr, Xe and combinations thereof at a temperature ranging from 700° C. to 1000° C.

During the first heat treatment operation S16a, the sacrificial layer 121 may be oxidized to form a first sacrificial oxide layer 121a, and portions of the active fins AF below the sacrificial layer 121 may be oxidized to form a second sacrificial oxide layer 123. For example, in a case in which the sacrificial layer 121 is formed of a SiN layer, the SiN layer may be oxidized by the oxygen radicals to form the first sacrificial oxide layer 121a formed of a SiON layer. The oxygen radicals may penetrate through the SiON layer to oxidize the surfaces of the active fins AF to form the second sacrificial oxide layer 123. For example, in a case in which the active fins AF are formed of silicon (Si), the second sacrificial oxide layer 123 may be a silicon oxide layer. During the first heat treatment operation S16a in which the sacrificial oxidation process is performed, the sacrificial layer 121, while being oxidized by itself, may serve to reduce a time for which the surfaces of the active fins AF are exposed to the oxygen radicals. Also, the first sacrificial oxide layer 121a itself may have oxygen permeability lower than that of the silicon oxide, and thus, an amount of oxygen radicals that penetrate through the first sacrificial oxide layer 121a to reach the surfaces of the active fins AF may be less than that of the silicon oxide. Thus, in the case in which the sacrificial oxidation process is performed after the formation of the sacrificial layer 121 as In example embodiments, an amount of loss made as the surfaces of the active fins AF are oxidized may be reduced compared with a case in which the sacrificial oxidation process is performed without the sacrificial layer 121. In detail, in the case in which the sacrificial oxidation process is performed after the formation of the sacrificial layer 121, a degree to which the upper corners of the active fins AF are rounded and an amount by which the width of the active fins AF is reduced due to oxidization of the lateral surfaces of the active fins AF may be reduced as compared with the case in which the sacrificial oxidation process is performed without the sacrificial layer 121.

As the second sacrificial oxide layer 123 is formed, the width W1*a* of the active films AF may be smaller than the width (W1 of FIG. 2F) of the active fins AF prior to the heat treatment process. A thickness T1*a* of the first sacrificial oxide layer 121*a* may be greater than the thickness (T1 of FIG. 2F) of the sacrificial layer 121.

In example embodiments, the width (W1 of FIG. 2F) of the active fins AF prior to the heat treatment process may be approximately 10 nm, and after the first heat treatment operation S16*a* is completed, a thickness T2 of the second sacrificial oxide layer may be 1 nm or less (e.g., greater than 0 nm and less than or equal to 1 nm). As a result, after the first heat treatment operation S16*a* is completed, the width W1*a* of the active fins AF may be 8 nm or greater. The width W1*a* of the active fins AF may be less than the width W1 of the active fins AF (see FIG. 2F).

The process of forming the sacrificial layer 121 on the active fins AF and the process of heat-treating the substrate with the sacrificial layer formed thereon may be performed in-situ within an identical annealing apparatus. The annealing apparatus may be a batch-type apparatus in which a plurality of substrates are processed at one time or a single-type apparatus in which substrates are processed one by one.

Figure 2H:
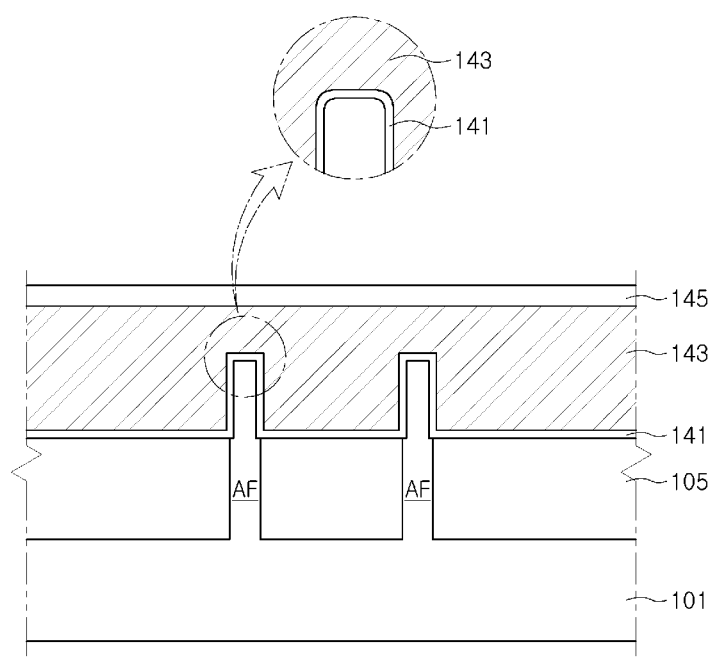

Referring to FIGS. 2H and 3, after the sacrificial oxide layers 121*a* and 123 are removed, a gate insulating layer 141 and a gate electrode 143 may be formed in operations S17 and S18.

First, the first sacrificial oxide layer 121*a* formed as the sacrificial layer 121 is oxidized and the second sacrificial oxide layer 123 formed as the surfaces of the active fins AF are oxidized may be removed through wet etching. Here, a portion of the isolation layer 105 may be etched.

Next, the gate insulating layer 141, the gate electrode 143, and a gate mask layer 145 may be sequentially formed on the substrate 101 including the active fins AF, from which the first and second sacrificial oxide layers 121*a* and 123 have been removed.

The gate insulating layer 141 may be formed on upper surfaces and lateral surfaces of the active fins AF, and may be a silicon oxide layer or a silicon oxynitride layer. The gate electrode 143 may be formed on upper surfaces and lateral surfaces of the active fins AF and may include doped polycrystalline silicon. The gate electrode 143 may further include a metal silicide on the polycrystalline silicon. According to example embodiments, the gate insulating layer 141 may be a high-k dielectric layer and the gate electrode 143 may include a metal. For example, the high-k dielectric layer may have a dielectric constant that is higher than a dielectric constant of silicon dioxide. The high-k dielectric layer may include at least one of a tantalum oxide, a titanium oxide, a hafnium oxide, a zirconium oxide, an aluminum oxide, an yttrium oxide, a niobium oxide, a hafnium silicate, a zirconium silicate, and combinations thereof. For example, the metal may include at least one of aluminum (Al), tungsten (W), and molybdenum (Mo).

Although not shown, the gate mask layer 145 may be patterned through photolithography and an etching process and, thereafter, the gate electrode 143 and the gate insulating layer 141 may be dry-etched to form a gate structure. In the present disclosure, the term gate structure may be used to signify a structure with a desired (and/or alternatively predetermined) pattern including the gate insulating layer 141 and the gate electrode 143.

Subsequently, impurity regions, source and drain regions, may be formed within the active fins AF at both sides of the gate structure through an ion implantation process.

Figure 4:
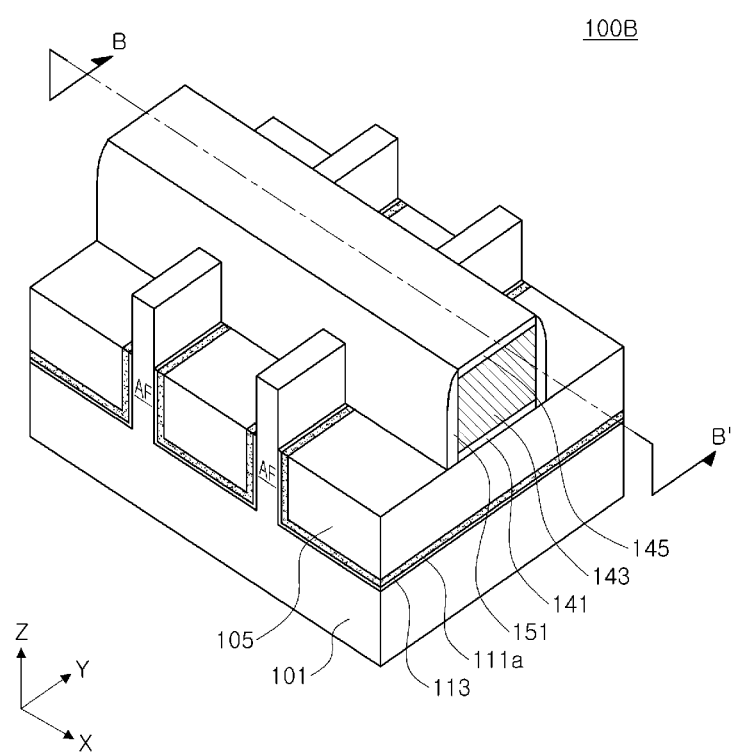
FIG. 4 is a perspective view schematically illustrating a semiconductor device according to example embodiments.

FIG. 4 is a perspective view schematically illustrating a semiconductor device according to example embodiments.

Referring to FIG. 4, a semiconductor device 100B according to example embodiments may include a substrate 101 including active fins AF defined by an isolation layer 105, a gate electrode 143 disposed to traverse the active fins AF, a gate insulating layer 141 disposed between the gate electrode 143 and the active fins AF, and a spacer 151 disposed on both side walls of the gate electrode 143. The gate insulating layer 141 may also be disposed between the gate electrode 143 and the isolation layer 105.

Unlike the semiconductor device 100A illustrated in FIG. 1, the semiconductor device 100B according to example embodiments may further include first and second sacrificial oxide layers 111*a* and 113 between the isolation layer 105 and the active fins AF. The first and second sacrificial oxide layers 111*a* and 113 will be described in detail in describing a manufacturing method with reference to FIGS. 5A through 5H hereinafter.

The content of descriptions of the components of the semiconductor device 100A with reference to FIG. 1 may also be applied as is to the components of the semiconductor device 100B illustrated in FIG. 5 denoted by the same reference numerals.

FIGS. 5A through 5H are cross-sectional views illustrating a method for manufacturing the semiconductor device 100B illustrated in FIG. 4 according to example embodiments. Specifically, FIGS. 5A through 5H are cross-sectional views taken along line B-B' of FIG. 4, illustrating each stage. FIG. 6 is a flow chart illustrating a method for manufacturing a semiconductor device according to example embodiments.

In describing the manufacturing method with reference to FIGS. 5A through 5H, parts repeatedly described as those of the manufacturing method described above with reference to FIGS. 2A through 2H will be briefly described or omitted.

Figure 5A:
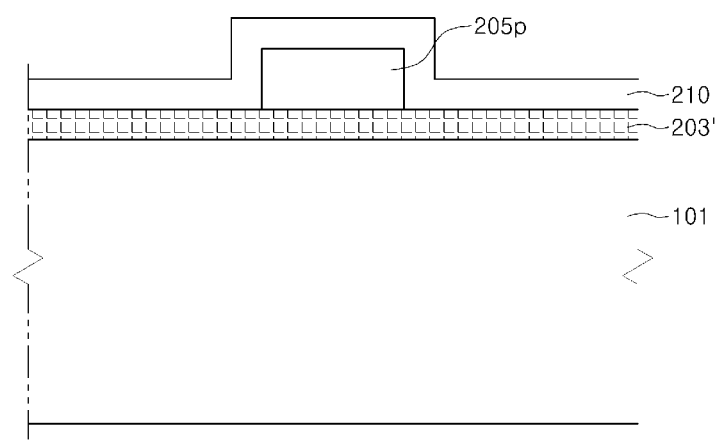
FIGS. 5A through 5H are cross-sectional views illustrating a method for manufacturing a semiconductor device illustrated in FIG. 4 according to example embodiments.
Figure 6:
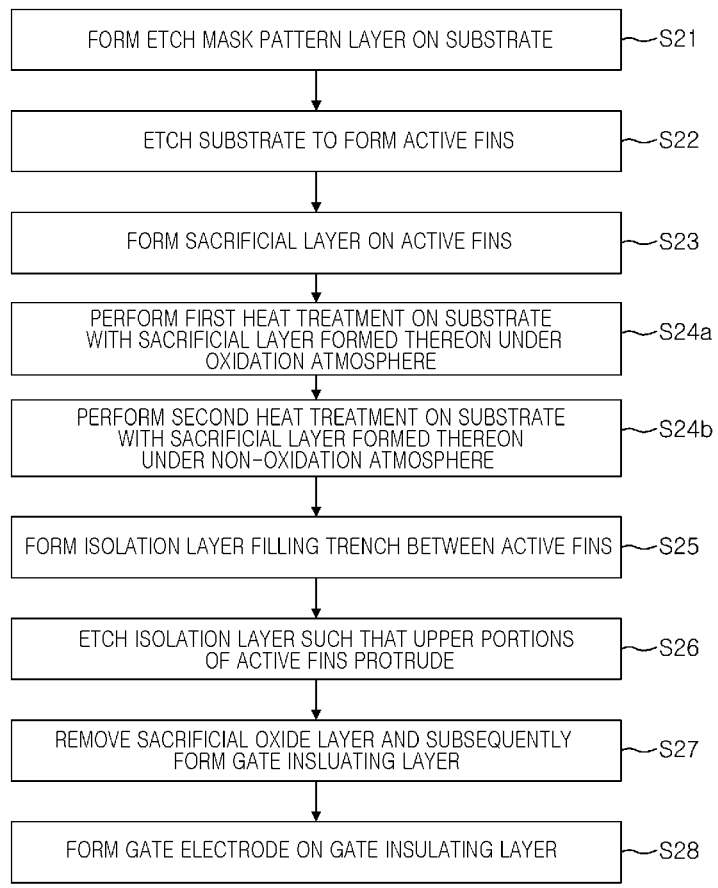
FIG. 6 is a flow chart illustrating a method for manufacturing a semiconductor device according to example embodiments.

Referring to FIG. 5A, a hard mask layer 203', a sacrificial pattern layer 205*p*, and a preliminary spacer layer 210 may be sequentially formed.

The size of the sacrificial pattern layer 205*p* may be determined in consideration of a space between the active fins AF (please refer to FIG. 5C) intended to be formed in a follow-up process.

The preliminary spacer layer 210 and the sacrificial pattern layer 205*p* may be formed of materials having etch selectivity with respect to each other.

Figure 5B:
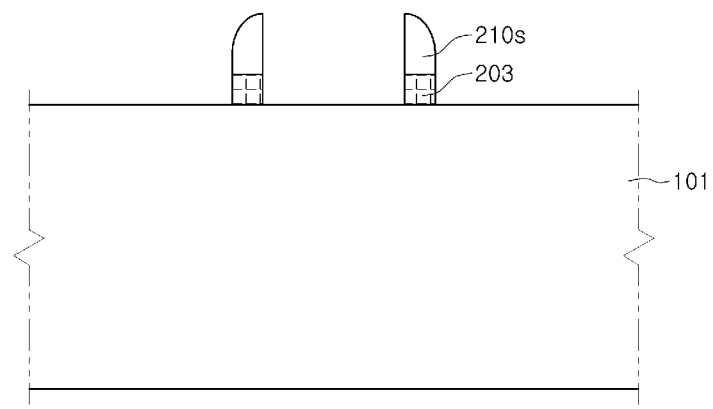

Referring to FIGS. 5B and 6, an etch mask pattern layer for forming active fins AF may be formed in operation S21.

First, the preliminary spacer layer 210 may be etched through an anisotropic etching process until when the hard mask layer 203' is exposed, whereby spacer layers 210*s* may be formed. The spacer layers 210*s* may be used as etch masks in patterning the hard mask layer 203'. Thus, widths of the spacer layers 210*s* on the side walls of the sacrificial pattern layer 205*p* may be determined in consideration of the width of active fins AF (please refer to FIG. 5C).

Subsequently, the sacrificial pattern layer 205 may be removed to leave only the spacer layers 210*s*. Thereafter, the hard mask layer 203' may be etched using the spacer layers 210*s* as etching masks to form the hard mask pattern layer 203.

Figure 5C:
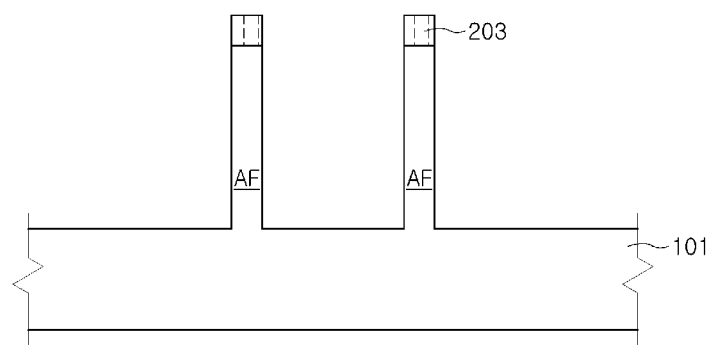

Referring to FIGS. 5C and 6, the substrate 101 may be etched using the etching mask pattern layers 210s and 203 defining active fins AF to form the active fins AF in operation S22.

The active fins AF may have a desired (and/or alternatively predetermined) width (x direction) determined by the width of the spacer layer 210s. The active fins AF may have a line shape having a narrow width and extend in the first direction (y direction in FIG. 4). A trench may be formed between the active fins AF through the etching process.

As the etching process, an RIE process may be used as an anisotropic etching process. While the etching process is being performed, the surface of the substrate 101 and the sides of the active fins AF may be etch-damaged due to collision of ionized particles, causing a trap site or a lattice defect on the surface of the substrate 101 and on the sides of the active fins AF.

Figure 5D:
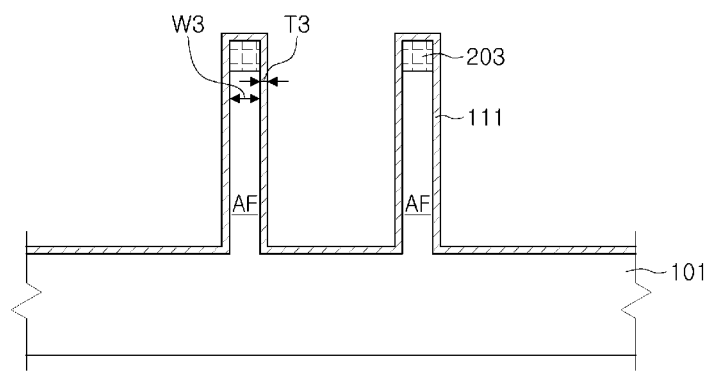

Referring to FIGS. 5D and 6, a sacrificial layer may be formed on the active fins AF in operation S23.

In example embodiments, the process of forming a sacrificial layer and heat-treating the sacrificial layer may be performed before an isolation layer 105 is formed.

In detail, a sacrificial layer 111 may be formed on the surfaces of the hard mask pattern layer 203 and the lateral surfaces of the active fins AF, and the sacrificial layer 111 may also be simultaneously formed on the substrate 101 between the active fins AF. A thickness T3 of the sacrificial layer 111 may be substantially equal on the lateral surfaces of the active fins AF and the substrate 101. Before the sacrificial layer 111 is formed, a cleaning process may be performed to remove contaminants generated during the etching process.

In example embodiments, the sacrificial layer 111 covering lateral surfaces of the active fins AF may be formed to reduce an amount of oxidization of the active fins AF during a follow-up sacrificial oxidation process (first heat treatment (S24a)).

The sacrificial layer 111 may include a material having oxygen permeability lower than that of a silicon oxide. For example, the sacrificial layer 121 may be any one selected from the group consisting of SiN, SiON, SiC, SiCN, SiOCN, SiOC, SiBN, and SiBCN. According to example embodiments, the sacrificial layer 111 may have a multilayer structure including materials selected from the foregoing group.

The sacrificial layer 111 may be formed to have an appropriate thickness within a thickness range from 1 nm to 5 nm in consideration of conditions of the follow-up sacrificial oxidation process. If the sacrificial layer 111 is excessively thick, the surfaces of the active fins AF below the sacrificial layer may not be oxidized during the follow-up sacrificial oxidation process (first heat treatment (S24a)) or a process time for oxidizing the surfaces of the active fins AF may be unnecessarily lengthened. If the sacrificial layer 111 is excessively thin, oxidization of the surfaces of the active fins AF may not be properly controlled. In example embodiments, the sacrificial layer 111 may be formed to have a thickness ranging from 1 nm to 2 nm.

The sacrificial layer 111 may be formed through a low pressure chemical vapor deposition (LPCVD) process or atomic layer deposition (ALD) process.

Figure 5E:
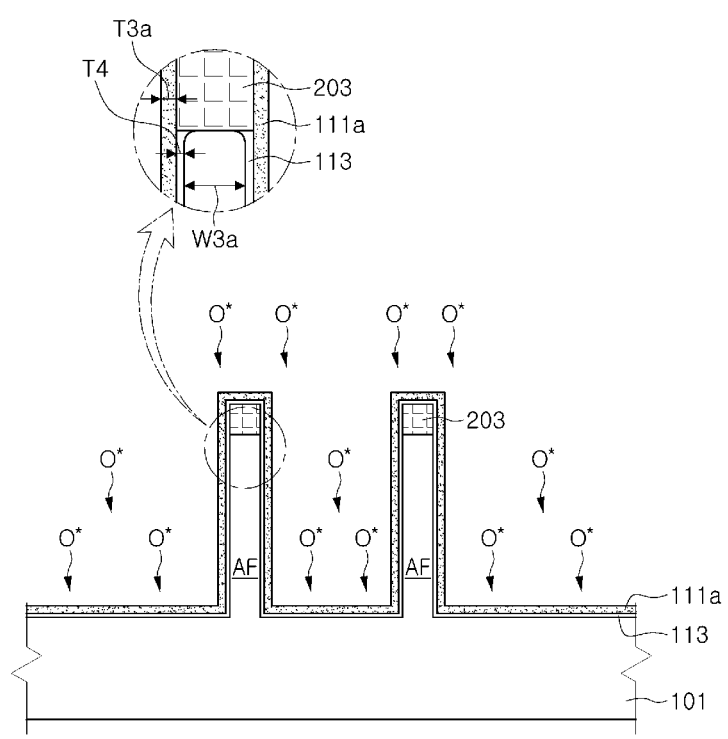

Referring to FIGS. 5E and 6, a process of heat-treating the substrate 101 with the sacrificial layer 111 formed thereon may be performed in operations S24a and S24b.

The heat treatment process may include first heat treatment operation S24a performed under an oxidation atmosphere and a second heat treatment operation S24b performed under a non-oxidation atmosphere.

The first heat treatment operation S24a is an operation of performing a sacrificial oxidation process. The materials enumerated to be used as materials of the sacrificial layer 111 have a low level of oxygen permeability, and thus, the sacrificial oxidation process may be performed using oxygen radicals having a size smaller than that of oxygen ($O_2$) and having high reactivity.

The first heat treatment operation S24a may be performed using oxygen radicals generated from any one selected from the group consisting of $O_2$, $O_3$, NO, $N_2O$, $H_2O$, and combinations thereof. In detail, the first heat treatment operation S24a may be performed in a thermal radical oxidation manner or a plasma radical oxidation manner. In a case in which the first heat treatment operation S24a is performed in the thermal radical oxidation manner, oxygen radicals may be generated by injecting oxygen ($O_2$) or ozone ($O_3$) together with hydrogen ($H_2$) at a temperature ranging from 700° C. to 1000° C. and pressure ranging from a few mTorr to tens of Torr. In a case in which the first heat treatment operation S24a is performed in a plasma radical oxidation manner, oxygen radicals may be generated by injecting an oxygen-contained gas (e.g., $O_2$, $O_3$, $H_2O$, NO, or $N_2O$) into an inert gas (e.g., argon (Ar) or xenon (Xe) plasma at a temperature ranging from 300° C. to 700° C. and at pressure ranging from a few mTorr to tens of Torr.

The second heat treatment operation S24b is additionally performed to anneal etch-damaged surfaces of the active fins AF (e.g., lattice defect). The second heat treatment operation S24b may be performed using any one selected from the group consisting of $H_2$, $N_2$, $NH_3$, He, Ar, Kr, Xe and combinations thereof at a temperature ranging from 700° C. to 1000° C.

During the first heat treatment operation S24a, the sacrificial layer 111 may be oxidized to form a first sacrificial oxide layer 111a, and portions of the active fins AF below the sacrificial layer 111 may be oxidized to form a second sacrificial oxide layer 113. For example, in a case in which the sacrificial layer 111 is formed of a SiN layer, the SiN layer may be oxidized by the oxygen radicals to form the first sacrificial oxide layer 121a formed of a SiON layer. The oxygen radicals may penetrate through the SiON layer to oxidize the surfaces of the active fins AF to form the second sacrificial oxide layer 113. For example, in a case in which the active fins AF are formed of silicon (Si), the second sacrificial oxide layer 113 may be a silicon oxide layer. During the first heat treatment operation S24a in which the sacrificial oxidation process is performed, the sacrificial layer 111, while being oxidized by itself, may serve to reduce a time for which the surfaces of the active fins AF are exposed to the oxygen radicals. Also, the first sacrificial oxide layer 111a itself may have oxygen permeability lower than that of the silicon oxide, and thus, an amount of oxygen radicals that penetrate through the first sacrificial oxide layer 111a to reach the surfaces of the active fins AF may be less than an amount of oxygen radicals that penetrate through the silicon oxide.

Thus, in the case in which the sacrificial oxidation process is performed after the formation of the sacrificial layer 111 as in example embodiments, an amount of loss made as the surfaces of the active fins AF are oxidized may be reduced compared with a case in which the sacrificial oxidation process is performed without the sacrificial layer 111. In detail, in the case in which the sacrificial oxidation process is performed after the formation of the sacrificial layer 111, a degree to which the upper corners of the active fins AF are rounded and an amount by which the width of the active fins AF is reduced due to oxidization of the lateral surfaces of the active fins AF may be reduced compared with the case in which the sacrificial oxidation process is performed without the sacrificial layer 111.

As the second sacrificial oxide layer 113 is formed, a width W3a of the active films AF may be smaller than the width (W3 of FIG. 5D) of the active fins AF prior to the heat treatment process. A thickness T3a of the first sacrificial oxide layer 111a may be greater than the thickness (T3 of FIG. 5D) of the sacrificial layer 111.

In example embodiments, the width (W3 of FIG. 5D) of the active fins AF prior to the heat treatment process may be approximately 10 nm, and after the first heat treatment operation S24a is completed, a thickness T4 of the second sacrificial oxide layer may be 1 nm or less (e.g., greater than 0 nm and less than or equal to 1 nm). As a result, after the first heat treatment operation S24a is completed, the width W3a of the active fins AF may be 8 nm or greater.

The process of forming the sacrificial layer 111 on the active fins AF and the process of heat-treating the substrate with the sacrificial layer formed thereon may be performed in-situ within an identical annealing apparatus. The device may be a batch-type apparatus in which a plurality of substrates are processed at one time or a single-type apparatus in which substrates are processed one by one.

Figure 5F:
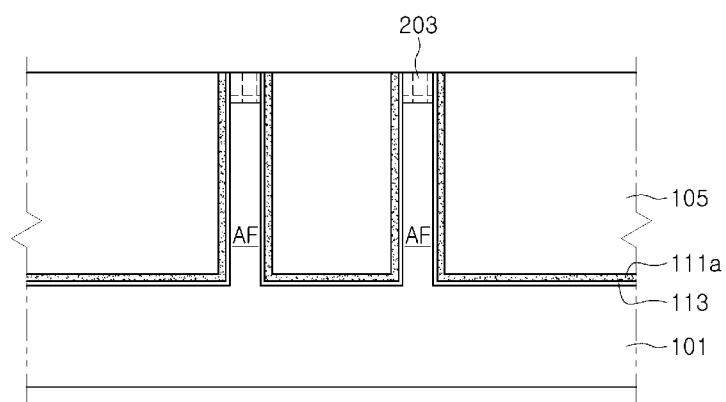

Referring to FIGS. 5F and 6, an isolation layer 105 may be formed to fill a trench between the active fins AF in operation S25.

First, an insulating layer may be formed to fill the trench between the active fins AF with the first and second sacrificial oxide layers 111a and 113 formed thereon, and a process of planarizing the insulating layer may subsequently be performed to expose an upper surface of the hard mask pattern layer 203.

The planarizing of the insulating layer may be a chemical mechanical polishing (CMP) process. While the insulating layer is being planarized, the first sacrificial oxide layer 111a formed on the upper surface of the hard mask pattern layer 203 may be removed.

Figure 5G:
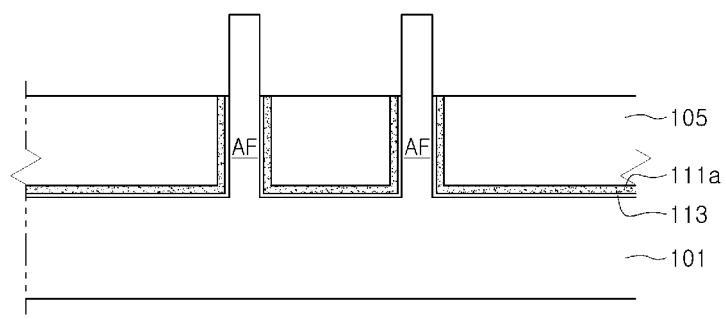

Referring to FIGS. 5G and 6, the isolation layer 105 may be etched such that the active fins AF protrude upwardly in operation S26.

First, the isolation layer 105 may be recessed to a desired (and/or alternatively predetermined) depth using dry etching such that the active fins AF protrude from the isolation layer 105. The dry etching process may be performed to etch only the isolation layer 105 using etching conditions having etch selectivity with respect to the first and second sacrificial oxide layers 111a and 113. While the dry etching process is being performed, the first and second sacrificial oxide layers 111a and 113 may limit and/or prevent lateral surfaces of the active fins AF from being etch-damaged. According to example embodiments, a process of recessing the isolation layer 105 may be performed using wet etching.

Subsequently, the hard mask pattern layer 203 may be removed, while limiting etching of the isolation layer 105 using a selective etching process.

Thereafter, the first and second sacrificial oxide layers 111a and 113 may be removed using a wet etching process such that upper surfaces and lateral surfaces of the active fins AF protrude from the isolation layer 105. Here, portions of the isolation layer 105 may be etched.

Alternatively, the hard mask pattern layer 203 may first be removed using a selective wet etching process, and thereafter, the isolation layer 105 may be etched to a desired (and/or alternatively predetermined) depth using a wet etching process to form a recess. Here, the wet etching process may be performed under etching conditions without etch selectivity with respect to the sacrificial oxide layers 111a and 113.

Figure 5H:
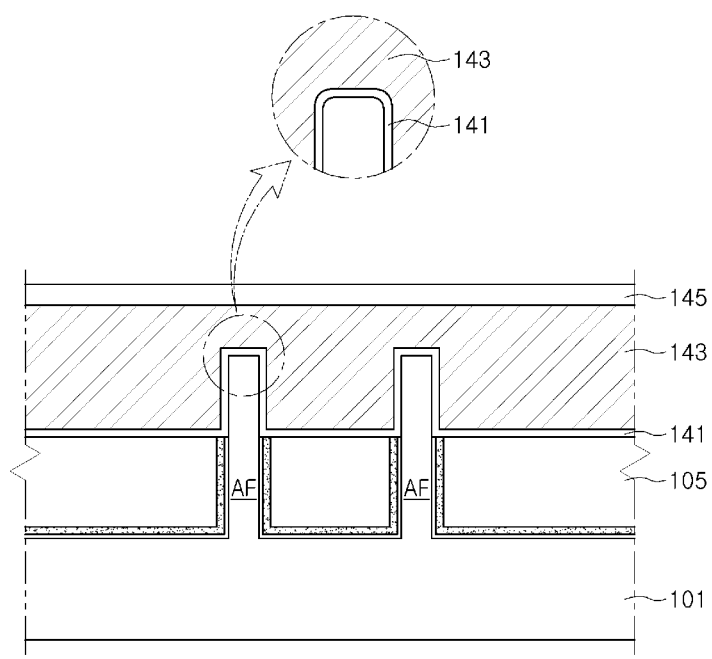

Referring to FIGS. 5H and 6, a gate insulating layer 141 and a gate electrode 143 may be formed on the active fins AF in operations S27 and S28.

The gate insulating layer 141, the gate electrode 143, and a gate mask layer 145 may be sequentially formed on the substrate 101 including the active fins AF from which the first and second sacrificial oxide layers 111a and 113 have been removed.

Although not shown, the gate mask layer 145 may be patterned through photolithography and an etching process and, thereafter, the gate electrode 143 and the gate insulating layer 141 may be dry-etched to form a gate structure. Subsequently, impurity regions, source and drain regions, may be formed within the active fins AF on both lateral surfaces of the gate structure through an ion implantation process.

Figure 7:
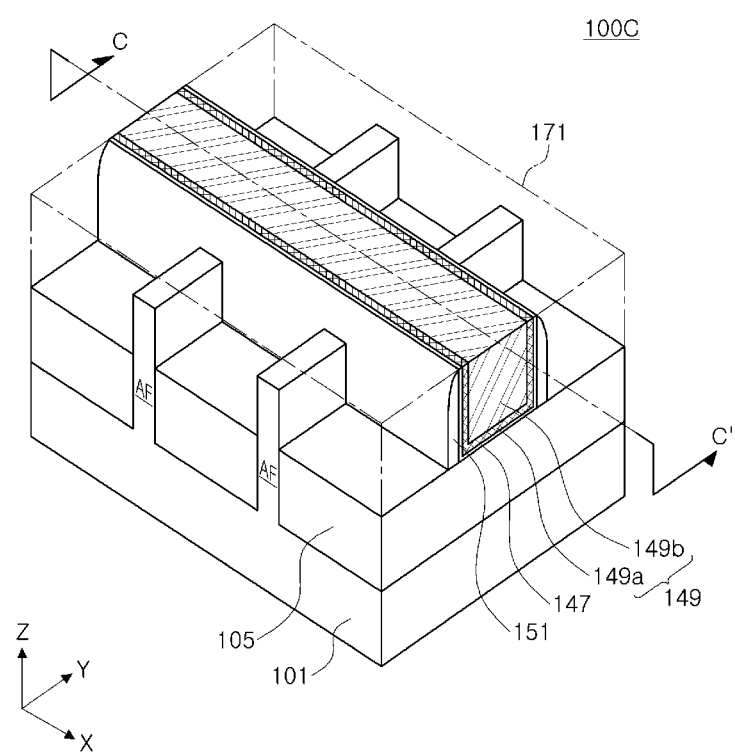
FIG. 7 is a perspective view schematically illustrating a semiconductor device according to example embodiments.

FIG. 7 is a perspective view schematically illustrating a semiconductor device according to example embodiments.

Referring to FIG. 7, unlike the semiconductor device 100A illustrated in FIG. 1, a semiconductor device 100C according to example embodiments may include a substrate 101 including active fins AF defined by an isolation layer 105, a metal gate electrode 149 disposed to traverse the active fins AF, a high-k dielectric gate insulating layer 147 disposed between the metal gate electrode 149 and the active fins AF, a spacer 151 disposed on both side walls of the metal gate electrode 149, and an interlayer insulating layer 171 disposed on the isolation layer 105. The high-k dielectric gate insulating layer 147 may also be disposed between the metal gate electrode 149 and the isolation layer 105. The high-k dielectric gate insulating layer 147 may also be disposed between the metal gate electrode 149 and the spacer 151.

The content of descriptions of the components of the semiconductor device 100A with reference to FIG. 1 may also be applied to the components of the semiconductor device 100C illustrated in FIG. 7 denoted by the same reference numerals as is.

The high-k dielectric gate insulating layer 147 may include an insulating material having permittivity higher than that of the silicon oxide, and may include at least one of a tantalum oxide, a titanium oxide, a hafnium oxide, a zirconium oxide, an aluminum oxide, an yttrium oxide, a niobium oxide, a hafnium silicate, a zirconium silicate, and combinations thereof.

The metal gate electrode 149 may include a first gate electrode 149a and a second gate electrode 149b. The first gate electrode 149a may be formed of a metal nitride. For example, the metal nitride may be formed of at least one of a titanium nitride (TiN), a tantalum nitride (TaN), and a tungsten nitride (WN). The second gate electrode 149b may be formed of a metal. For example, the metal may be at least one of aluminum (Al), tungsten (W), and molybdenum (Mo). The first gate electrode 149a may serve as a diffusion barrier with respect to the metal forming the second gate electrode 149b.

Figure 8A:
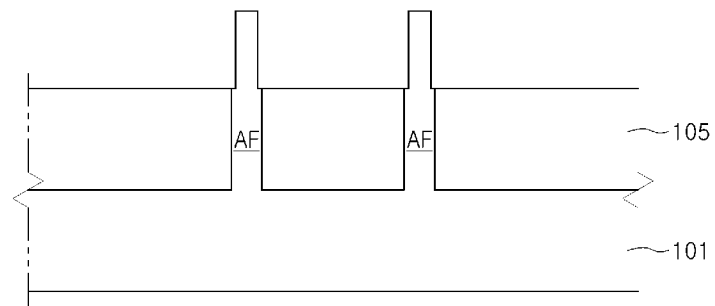
FIGS. 8A and 8B are cross-sectional views illustrating a method for manufacturing a semiconductor device illustrated in FIG. 7 according to example embodiments.
Figure 8B:
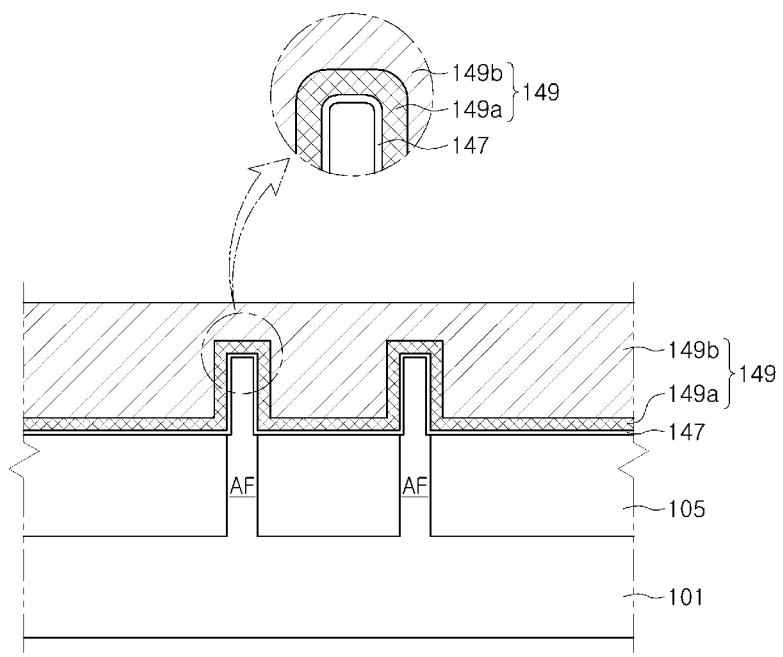

FIGS. 8A and 8B are cross-sectional views illustrating a method for manufacturing a semiconductor device illustrated in FIG. 7 according to example embodiments. Specifically, FIGS. 8A and 8B are cross-sectional views taken along line C-C' of FIG. 7, illustrating each stage.

Although not shown, first, an interlayer insulating layer (171 of FIG. 7) may be formed on the semiconductor device 100A illustrated in FIG. 1. The interlayer insulating layer (171 of FIG. 7) may be one of an oxide layer, a nitride layer, and an oxynitride layer. Subsequently, the interlayer insulating layer (171 of FIG. 7) may be planarized until when an upper surface of the gate electrode 143 is exposed.

Thereafter, referring to FIG. 8A, the gate electrode 143 and the gate insulating layer 141 may be removed. As a result, upper surfaces and lateral surfaces of the active fins AF, and the isolation layer 105 may be exposed.

Referring to FIG. 8B, a high-k dielectric gate insulating layer 147 and a metal gate electrode 149 may be formed.

The high-k dielectric gate insulating layer 147 may be formed to have a substantially uniform thickness on the upper surfaces and lateral surfaces of the active fins AF and the isolation layer 105. Although not shown in FIG. 8, referring to FIG. 7, the high-k dielectric gate insulating layer 147 may also be formed on the lateral surface of the spacer 151.

The metal gate electrode 149 may be formed by sequentially forming the first gate electrode 149a and the second gate electrode 149b on the high-k dielectric gate insulating layer 147.

Figure 9:
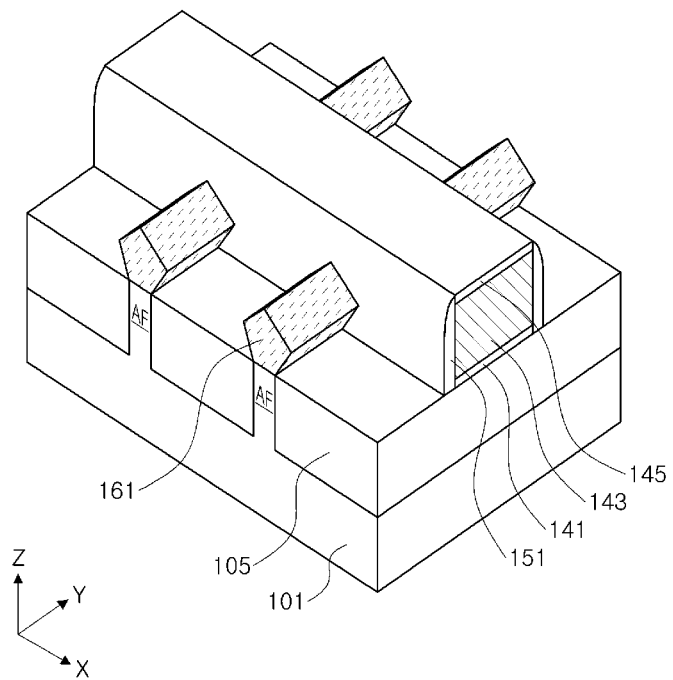
FIG. 9 is a perspective view schematically illustrating a semiconductor device according to example embodiments.

FIG. 9 is a perspective view schematically illustrating a semiconductor device according to example embodiments.

Referring to FIG. 9, unlike the semiconductor device 100A illustrated in FIG. 1, a semiconductor device 100D according to example embodiments may include a substrate 101 including active fins AF defined by an isolation layer 105, a gate electrode 143 disposed to traverse the active fins AF, a gate insulating layer 141 disposed between the gate electrode 143 and the active fins AF, and a spacer 151 disposed on both side walls of the gate electrode 143. The semiconductor device 100D according to example embodiments may further include source/drain stressors 161 disposed on the active fins AF on both sides of the gate electrode 143. The gate insulating layer 141 may also be disposed between the gate electrode 143 and the isolation layer 105.

The source/drain stressors 151 may be formed by removing portions of the active fins AF exposed on both sides of the gate electrode 143 to form recesses and performing an epitaxial process on the recessed active fins AF. In FIG. 9, the recesses are level with the upper surface of the isolation layer 105, but according to example embodiments, the recesses may be formed to be lower than the upper surface of the isolation layer 105.

The source/drain stressors 161 may be formed of different materials depending on whether the semiconductor device 100D according to example embodiments is an n-channel metal-oxide-semiconductor (NMOS) transistor or a p-channel metal-oxide-semiconductor (PMOS) transistor. For example, in a case in which the substrate 101 is formed of silicon (Si) and the semiconductor device 100D is an NMOS transistor, the source/drain stressors 161 may be formed of SiC, and in this case, tensile stress may act on a channel region of the NMOS transistor. In a case in which the substrate 101 is formed of silicon (Si) and the semiconductor device 100D is a PMOS transistor, the source/drain stressors 161 may be formed of SiGe, and in this case, compressive stress may act on a channel region of the PMOS transistor. The stress acting on the channel region may increase a driving current of the corresponding transistor.

The source/drain stressors 161 may have various shapes, and for example, as illustrated in FIG. 9, the source/drain stressors 161 may have a pentagonal cross-section.

Figure 10:
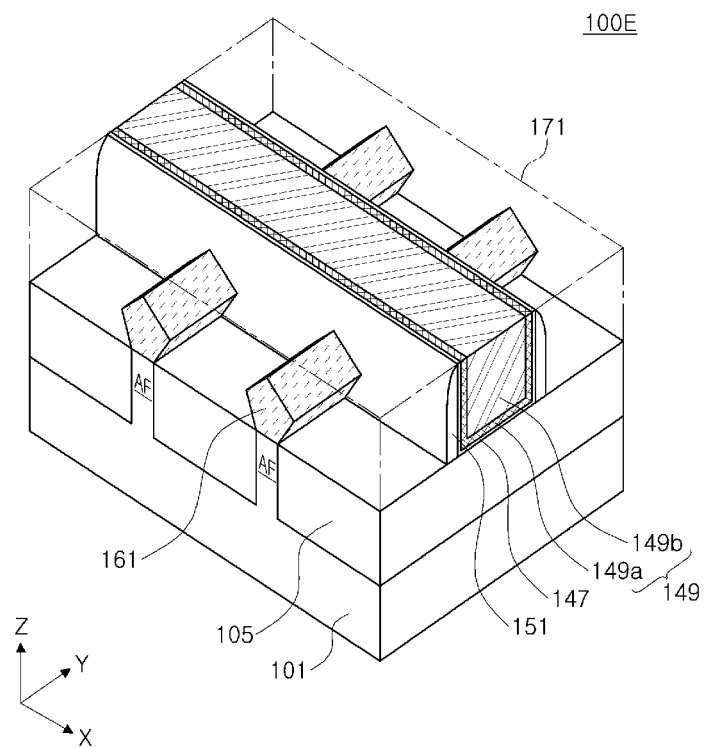
FIG. 10 is a perspective view schematically illustrating a semiconductor device according to example embodiments.

FIG. 10 is a perspective view schematically illustrating a semiconductor device according to example embodiments.

A semiconductor device illustrated in FIG. 10 has a structure obtained by combining the semiconductor device 100C illustrated in FIG. 7 and the semiconductor device 100D illustrated in FIG. 9.

Referring to FIG. 10, unlike the semiconductor device 100A illustrated in FIG. 1, a semiconductor device 100E according to example embodiments may include a substrate 101 including active fins AF defined by an isolation layer 105, a metal gate electrode 149 disposed to traverse the active fins AF, a high-k dielectric gate insulating layer 147 disposed between the metal gate electrode 149 and the active fins AF, a spacer 151 disposed on both side walls of the metal gate electrode 149, and an interlayer insulating layer 171 disposed on the isolation layer 105. The semiconductor device 100E according to example embodiments may further include source/drain stressors 161 disposed on the active fins AF on both sides of the metal gate electrode 149. The high-k dielectric gate insulating layer 147 may also be disposed between the metal gate electrode 149 and the isolation layer 105. The high-k dielectric gate insulating layer 147 may also be disposed between the metal gate electrode 149 and the spacer 151.

Figure 11:
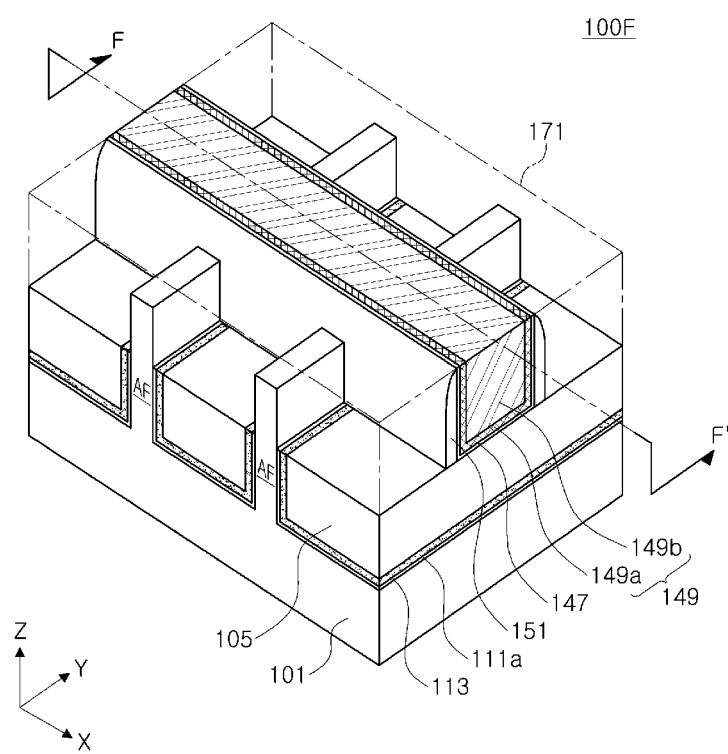
FIG. 11 is a perspective view schematically illustrating a semiconductor device according to example embodiments.

FIG. 11 is a perspective view schematically illustrating a semiconductor device according to example embodiments.

Referring to FIG. 11, unlike the semiconductor device 100B illustrated in FIG. 4, a semiconductor device 100F according to example embodiments may include a substrate 101 including active fins AF defined by an isolation layer 105, a metal gate electrode 149 disposed to traverse the active fins AF, a high-k dielectric gate insulating layer 147 disposed between the metal gate electrode 149 and the active fins AF, a spacer 151 disposed on both side walls of the metal gate electrode 149, first and second sacrificial oxide layers 111a and 113 disposed between the isolation layer 105 and the active fins AF, and an interlayer insulating layer 171 disposed on the isolation layer 105. The high-k dielectric gate insulating layer 147 may also be disposed between the metal gate electrode 149 and the isolation layer 105. The high-k dielectric gate insulating layer 147 may also be disposed between the metal gate electrode 149 and the spacer 151.

The first sacrificial oxide layer 111a may be formed as the sacrificial layer (111 of FIG. 5D) is oxidized. The sacrificial layer (111 of FIG. 5D) may be any one selected from the group consisting of SiN, SiON, SiC, SiCN, SiOCN, SiOC, SiBN, and SiBCN. According to example embodiments, the sacrificial layer 121 may have a multilayer structure formed of materials selected from the foregoing group.

The second sacrificial oxide layer 113 may be formed as surfaces of the active fins AF and the surface of the substrate 101 are oxidized below the first sacrificial oxide layer 111a.

Figure 12A:
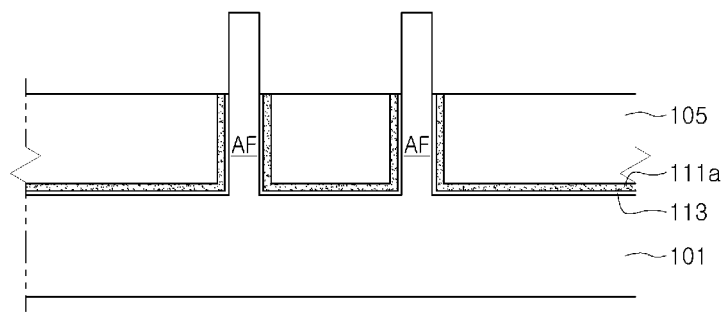
FIGS. 12A and 12B are cross-sectional views illustrating a method for manufacturing a semiconductor device illustrated in FIG. 1 according to example embodiments.
Figure 12B:
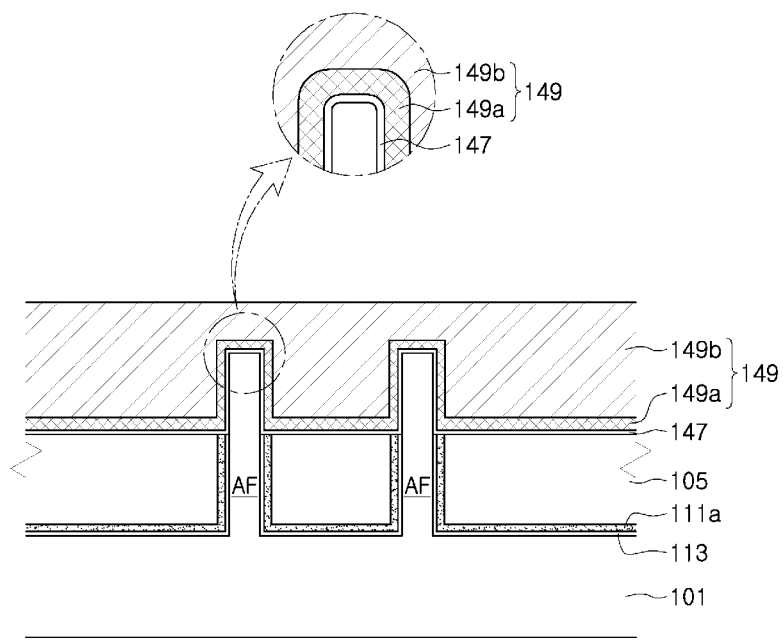

FIGS. 12A and 12B are cross-sectional views illustrating a method for manufacturing a semiconductor device illustrated in FIG. 1 according to example embodiments. Specifically, FIGS. 12A and 12B are cross-sectional views taken along line F-F' of FIG. 11, illustrating each stage.

Referring to FIGS. 12A and 12B, a high-k dielectric gate insulating layer 147 and a metal gate electrode 149 may be formed by applying the manufacturing method described above with reference to FIGS. 8A and 8B as is.

Figure 13:
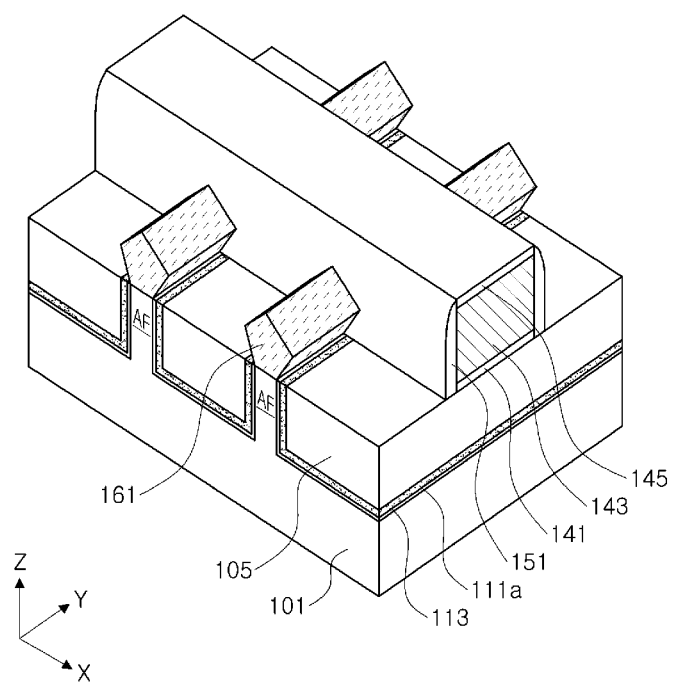
FIG. 13 is a perspective view schematically illustrating a semiconductor device according to example embodiments.

FIG. 13 is a perspective view schematically illustrating a semiconductor device according to example embodiments.

Referring to FIG. 13, unlike the semiconductor device 100B illustrated in FIG. 4, a semiconductor device 100G according to example embodiments may include a substrate 101 including active fins AF defined by an isolation layer 105, a gate electrode 143 disposed to traverse the active fins AF, a gate insulating layer 141 disposed between the gate electrode 143 and the active fins AF, a spacer 151 disposed on both side walls of the gate electrode 143, first and second sacrificial oxide layers 111a and 113 disposed between the isolation layer 105 and the active fins AF, and source/drain stressors 161 disposed on the active fins AF on both sides of the gate electrode 143. The gate insulating layer 141 may also be disposed between the gate electrode 143 and the isolation layer 105.

The source/drain stressors 151 may be formed by removing portions of the active fins AF exposed on both sides of the gate electrode 143 to form recesses and performing an epitaxial process on the recessed active fins AF. In FIG. 13, the recesses are level with the upper surface of the isolation layer 105, but according to example embodiments, the recesses may be formed to be lower than the upper surface of the isolation layer 105.

Figure 14:
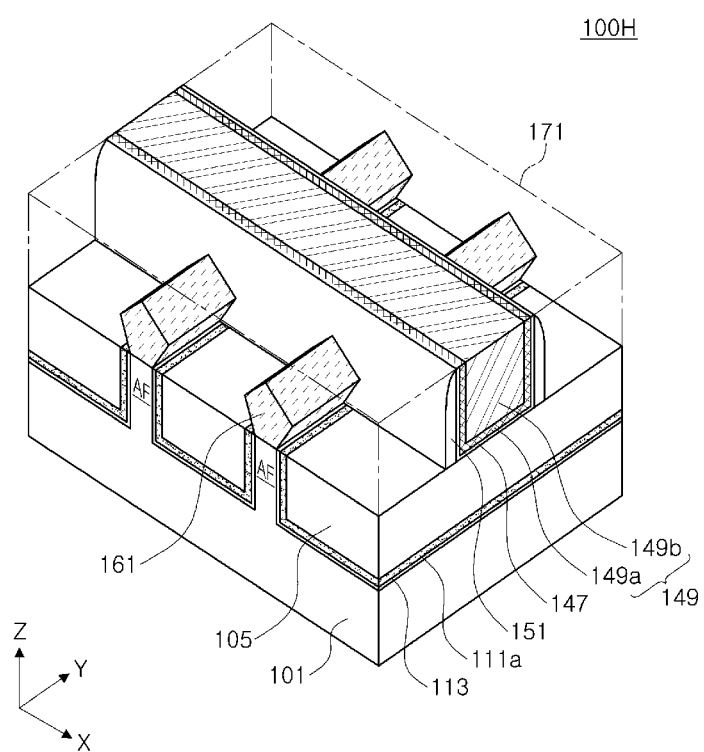
FIG. 14 is a perspective view schematically illustrating a semiconductor device according to example embodiments.

FIG. 14 is a perspective view schematically illustrating a semiconductor device according to example embodiments.

A semiconductor device H illustrated in FIG. 14 has a structure obtained by combining the semiconductor device 100F illustrated in FIG. 11 and the semiconductor device 100G illustrated in FIG. 13.

Referring to FIG. 14, unlike the semiconductor device 100B illustrated in FIG. 4, a semiconductor device 100H according to example embodiments may include a substrate 101 including active fins AF defined by an isolation layer 105, a metal gate electrode 149 disposed to traverse the active fins AF, a high-k dielectric gate insulating layer 147 disposed between the metal gate electrode 149 and the active fins AF, a spacer 151 disposed on both side walls of the metal gate electrode 149, first and second sacrificial oxide layers 111a and 113 disposed between the isolation layer 105 and the active fins AF, an interlayer insulating layer 171 disposed on the isolation layer 105, and source/drain stressors 161 disposed on the active fins AF on both sides of the metal gate electrode 149. The high-k dielectric gate insulating layer 147 may also be disposed between the metal gate electrode 149 and the isolation layer 105. The high-k dielectric gate insulating layer 147 may also be disposed between the metal gate electrode 149 and the spacer 151.

Figure 15:
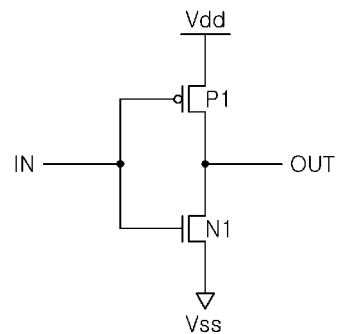
FIG. 15 is a circuit diagram of an inverter including a semiconductor device according to example embodiments.

FIG. 15 is a circuit diagram of a complementary metal-oxide semiconductor (CMOS) inverter including a semiconductor device according to example embodiments.

Referring to FIG. 15, the CMOS inverter may include a PMOS transistor P1 and an NMOS transistor N1. The PMOS and NMOS transistors may be connected in series between a power supply line Vdd and a ground line Vss, and input signals may be commonly input to gates of the PMOS and NMOS transistors. Output signals may be commonly output from drains of the PMOS and NMOS transistors. A driving voltage may be applied to a source of the PMOS transistor, and a ground voltage may be applied to a source of the NMOS transistor. The CMOS inverter may invert an input signal IN and output the inverted signal as an output signal OUT. In other words, when a logic level "1" is input as an input signal of the inverter, a logic level "0" may be output as an output signal, and when a logic level "0" is input as an input signal of the inverter, a logic level "1" may be output as an output signal. The PMOS and NMOS transistors P1 and N1 may be one of the semiconductor devices 100A, 100B, 100C, 100D, 100E, 100F, 100G, and 100H according to example embodiments described above.

Figure 16:
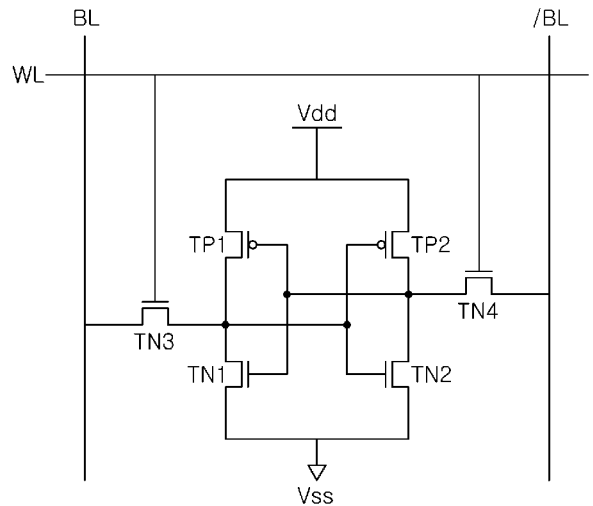
FIG. 16 is a circuit diagram of an SRAM cell including a semiconductor device according to example embodiments.

FIG. 16 is a circuit diagram of a SRAM cell including a semiconductor device according to example embodiments.

Referring to FIG. 16, in an SRAM device, one cell may include first and second driving transistors TN1 and TN2, first and second load transistors TP1 and TP2, and first and second access transistors TN3 and TN4. Here, sources of the first and second driving transistors TN1 and TN2 may be connected to a ground line Vss, and sources of the first and second load transistors TP1 and TP2 may be connected to a power supply line Vdd.

The first driving transistor TN1 configured as an NMOS transistor and the first load transistor TP1 configured as a PMOS transistor may form a first inverter, and the second driving transistor TN2 configured as an NMOS transistor and the second load transistor TP2 configured as a PMOS transistor may form a second inverter. The transistors forming the cells of the SRAM device may be one of the semiconductor devices 100A, 100B, 100C, 100D, 100E, 100F, 100G, and 100H according to the example embodiments of the present disclosure described above.

Output terminals of the first and second inverters may be connected to sources of the first access transistor TN3 and the second access transistor TN4, respectively. Also, in order to a single latch circuit, input terminals and output terminals of the first and second inverters may be connected in a crossing manner. Drains of the first and second access transistors TN3 and TN4 may be connected to first and second bit lines BL and /BL, respectively.

Figure 17:
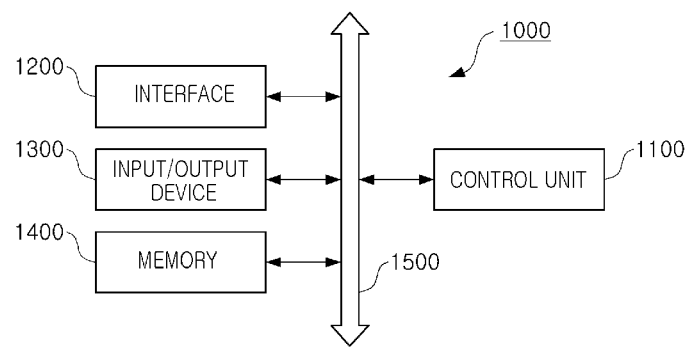
FIGS. 17 and 18 are block diagrams illustrating an electronic device and a storage device including a semiconductor device according to example embodiments.
Figure 18:
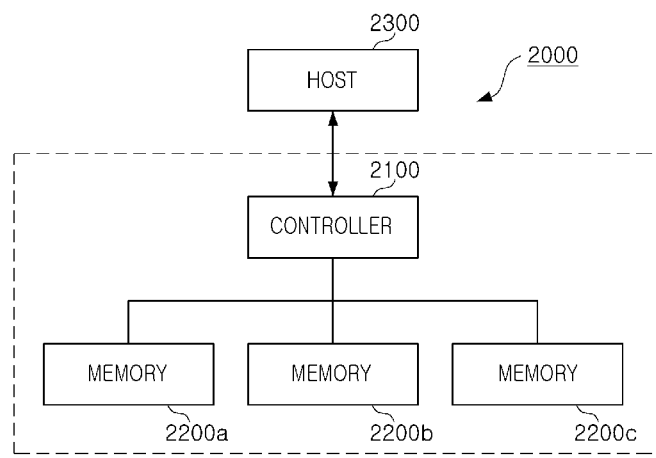

FIGS. 17 and 18 are block diagrams illustrating an electronic device and a storage device including a semiconductor device according to example embodiments.

Referring to FIG. 17, an electronic device 1000 including a semiconductor device according to example embodiments may include a control unit 1100, an interface 1200, an input/output device 1300, and a memory 1400. The control unit 1100, the interface 1200, the input/output device 1300, and the memory 1400 may be connected via a BUS 1500 providing a passage through which data is delivered.

The control unit 1100 may include a device such as at least one among a microprocessor, a digital signal processor, and a microcontroller. The memory 1400 may include a device that may read and write data in various manners. The control unit 1100 and the memory 1400 may include at least one of the semiconductor devices 100A, 100B, 100C, 100D, 100E, 100F, 100G, and 100H according to example embodiments described above.

The input/output device 1300 may include a keypad, a keyboard, a touch screen device, a display device, an audio input/output module, and the like. The interface 1200 may be a module for transmitting and receiving data via a communication network, and may include an antenna, a wired/wireless transceiver, and the like. Besides the components illustrated in FIG. 17, the electronic device 1000 may further include an application chip set, an imaging device, and the like. The electronic device 1000 illustrated in FIG. 17 is not limited in terms of category, and may be various devices such as a personal digital assistant (PDA), a portable computer, a mobile phone, a wireless phone, a laptop computer, a memory card, a portable multimedia player, and a tablet PC.

Referring to FIG. 18, a storage device 2000 including a semiconductor device according to example embodiments may include a controller 2100 communicating with a host 2300 and memories 2200a, 2200b, and 2200c storing data. The controller 2100 and the memories 2200a, 2200b, and 2200c may include at least one of the semiconductor devices 100A, 100B, 100C, 100D, 100E, 100F, 100G, and 100H according to example embodiments.

The host 2300 communicating with the controller 2100 may be various electronic devices in which the storage device 200 is installed. For example, the host 2300 may be a smartphone, a digital camera, a desktop computer, a laptop computer, a portable media player, and the like. The controller 2100 may receive a data write or read request delivered from the host 2300 and store data in the memories 2200a, 2200b, and 2200c, or may generate a command CMD for retrieving data from the memories 2200a, 2200b, and 2200c.

As set forth above, according to example embodiments, since the sacrificial layer is formed on the active fins, rounding of the upper corners of the active fins and a reduction in the width of the active fins may be suppressed, whereby a substantial width of the active fins may be secured to a desired level.

It should be understood that example embodiments described herein should be considered in a descriptive sense only and not for purposes of limitation. Descriptions of features or aspects within each device or method according to example embodiments should typically be considered as available for other similar features or aspects in other devices or methods according to example embodiments. While some example embodiments have been particularly shown and described, it will be understood by one of ordinary skill in the art that variations in form and detail may be made therein without departing from the spirit and scope of the claims.

What is claimed is:

1. A method for manufacturing a semiconductor device, the method comprising:
    forming a trench in a substrate, the trench defining a plurality of active fins;
    forming a sacrificial layer on the plurality of active fins;
    forming a sacrificial oxide layer on the plurality of active fins, the forming the sacrificial oxide layer including heat-treating the sacrificial layer and surfaces of the plurality of active fins; and
    removing the sacrificial oxide layer.

2. The method of claim 1, wherein the sacrificial layer includes a material having an oxygen permeability that is lower than an oxygen permeability of silicon oxide.

3. The method of claim 1, wherein the sacrificial layer includes one of SiN, SiON, SiC, SiCN, SiOCN, SiOC, SiBN, SiBCN, and combinations thereof.

4. The method of claim 1, wherein the sacrificial layer has a thickness ranging from 1 nm to 5 nm.

5. The method of claim 1, wherein the forming the sacrificial oxide layer includes performing a first heat treatment operation under an oxidation atmosphere and performing a second heat treatment operation under a non-oxidation atmosphere.

6. The method of claim 5, wherein the forming the sacrificial oxide layer includes:
    forming a first sacrificial oxide layer as the sacrificial layer is oxidized during the first heat treatment operation, and
    forming a second sacrificial oxide layer as portions of the active fins below the first sacrificial oxide layer are oxidized.

7. The method of claim 6, wherein a thickness of the second sacrificial oxide layer is greater than 0 nm and less than or equal to 1 nm.

8. The method of claim 5, wherein the performing the first heat treatment operation includes using oxygen radicals generated from one of $O_2$, $O_3$, $H_2O$, NO, $N_2O$, and combinations thereof.

9. The method of claim 5, wherein the performing the second heat treatment operation includes using one of $H_2$, $N_2$, $NH_3$, He, Ar, Kr, Xe and combinations thereof.

10. The method of claim 1, wherein
    the forming the plurality of active fins includes,
        forming a mask pattern on the substrate, and
        etching the substrate using the mask pattern as an etch mask; and
    the forming sacrificial layer includes forming the sacrificial layer on the mask pattern, lateral surfaces of the plurality of active fins, and the substrate.

11. The method of claim 1, further comprising:
    forming an isolation layer on the substrate such that upper portions of the plurality of active fins protrude through the isolation layer, wherein
        the forming the sacrificial layer and the forming the sacrificial oxide layer are performed after the forming the isolation layer.

12. The method of claim 11, wherein
    the forming the isolation layer includes,
        forming an insulating layer filling the trench between the plurality of active fins, and
        exposing the upper portions of the plurality of active fins by etching the insulating layer; and
    the forming the sacrificial layer includes forming the sacrificial layer on upper surfaces and lateral surfaces of the exposed upper portions of the active fins and on the isolation layer.

13. The method of claim 1, wherein the forming sacrificial layer and the forming the sacrificial oxide layer are performed in-situ.

14. The method of claim 1, further comprising:
    forming a gate insulating layer and a gate electrode on the active fins after the removing the sacrificial layer.

15. A method for manufacturing a semiconductor device, the method comprising:
    forming a trench in a substrate, the trench defining a plurality of active fins;
    forming an isolation layer that fills a lower portion of the trench to a height that is below a height of the plurality of active fins such that the plurality of active fins protrude through the isolation layer;
    depositing a sacrificial layer on upper surfaces and lateral surfaces of the plurality of active fins;
    forming a sacrificial oxide layer on the plurality of active fins, the forming the sacrificial oxide layer including oxidizing the sacrificial layer and surfaces of the plurality of active fins;
    removing the sacrificial oxide layer; and
    forming a gate structure on the plurality of active fins that traverses the plurality of active fins.

16. A method for manufacturing a semiconductor device, the method comprising:
    forming a sacrificial layer contacting at least a sidewall of a plurality of active fins,
        the plurality of active fins defined by a trench in a substrate and each including corners at a top portion; and
    rounding the corners of the top portion of the plurality of active fins, the rounding the corners including,
        transforming the sacrificial layer into first and second sacrificial oxide layers, and
        removing the first and second sacrificial oxide layers.

17. The method of claim 16, wherein the sacrificial layer includes a material having an oxygen permeability that is lower than an oxygen permeability of silicon oxide.

18. The method of claim 17, wherein
    the rounding the corners includes,
        performing a first heat treatment operation under an oxidization atmosphere to form the first sacrificial oxide layer, and
        performing a second heat treatment operation under a non-oxidation atmosphere to form the second sacrificial oxide layer; and
    the second heat treatment operation is performed after the first heat treatment operation.

19. The method of claim 16, further comprising:
    forming a gate insulating layer on the active fins after the removing the first and second sacrificial oxide layers; and
    forming a gate electrode on the gate insulating layer, wherein the sacrificial layer includes one of SiN, SiON, SiC, SiCN, SiOCN, SiOC, SiBN, SiBCN, and combinations thereof.

20. The method of claim 16, wherein
a thickness of the sacrificial layer is in a range from 1 nm to 5 nm, and
a thickness of the second sacrificial oxide layer is greater than 0 nm and less than or equal to 1 nm.

* * * * *